(12) United States Patent
Wada et al.

(10) Patent No.: US 8,338,288 B2
(45) Date of Patent: Dec. 25, 2012

(54) METHOD OF MANUFACTURING SEMICONDUCTOR DEVICE

(75) Inventors: Tamaki Wada, Kawasaki (JP); Akihiro Tobita, Kawasaki (JP); Seiichi Ichihara, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 49 days.

(21) Appl. No.: 13/081,160

(22) Filed: Apr. 6, 2011

(65) Prior Publication Data

US 2011/0248406 A1 Oct. 13, 2011

(30) Foreign Application Priority Data

Apr. 9, 2010 (JP) .................................. 2010-090152

(51) Int. Cl.
*H01L 21/44* (2006.01)

(52) U.S. Cl. .................. 438/614; 257/E23.01; 257/736; 257/781; 257/786; 438/113; 438/612

(58) Field of Classification Search ........... 257/E21.477, 257/E21.599, E23.01, 773–776, 779–781, 257/786, 736, 737; 438/113, 280, 612–614, 438/619, 638, 666
See application file for complete search history.

(56) References Cited

U.S. PATENT DOCUMENTS

| 5,773,359 | A  | * | 6/1998  | Mitchell et al. ............... 438/614 |
| 6,426,556 | B1 | * | 7/2002  | Lin ............................... 257/738 |
| 6,436,300 | B2 | * | 8/2002  | Woolsey et al. ............... 216/13 |
| 6,452,270 | B1 | * | 9/2002  | Huang .......................... 257/738 |
| 6,462,426 | B1 | * | 10/2002 | Kelkar et al. .................. 257/781 |
| 6,509,582 | B1 | * | 1/2003  | Bendall .......................... 257/48 |
| 6,512,298 | B2 | * | 1/2003  | Sahara et al. .................. 257/773 |
| 6,545,355 | B2 | * | 4/2003  | Yanagida ....................... 257/738 |
| 6,555,459 | B1 | * | 4/2003  | Tokushige et al. ............. 438/612 |
| 7,541,275 | B2 | * | 6/2009  | Mercer et al. ................. 438/614 |
| 2009/0127709 | A1 | * | 5/2009 | Sameshima .................... 257/737 |

\* cited by examiner

*Primary Examiner* — Chris Chu

(74) *Attorney, Agent, or Firm* — Womble Carlyle

(57) ABSTRACT

In connection with a semiconductor device in which a conductive member is coupled to the surface of a bonding pad exposed from an opening formed in a passivation film, there is provided a technique able to suppress the occurrence of a crack in the passivation film. A second planar distance between a first end of an electrode layer and a first end of a pad is greater than a first planar distance between the first end of the electrode layer and a first end of an opening. Since the second planar distance between the first end of the electrode layer and the first end of the pad is long, even when a coupled position of wire is deviated to the first end side of the electrode layer, stress caused by coupling of the wire to a stepped portion of the electrode layer can be prevented from being transmitted to the first end portion of the pad.

26 Claims, 26 Drawing Sheets

L3(a) > L3(b)
L4(a) = L4(b)
L5(a) > L5(b)

EL: ELECTRODE LAYER
OP: OPENING
PAS: PASSIVATION FILM
PAD: PAD
W: WIRE

METHOD OF MANUFACTURING SEMICONDUCTOR DEVICE

CROSS-REFERENCE TO RELATED APPLICATIONS

The disclosure of Japanese Unexamined Patent Publication No. 2010-90152 filed on Apr. 9, 2010 including the specification, drawings and abstract is incorporated herein by reference in its entirety.

BACKGROUND

The present invention relates to a method of manufacturing a semiconductor device. Particularly, the present invention is concerned with a technique applicable effectively to a manufacturing technique for a semiconductor device in which a conductive member is coupled through an electrode layer to a bonding pad, the bonding pad being exposed from an opening formed in a passivation film.

In Japanese Unexamined Patent Publication No. 2009-124042 (Patent Document 1) there is described a structure in which a solder ball is mounted through both barrier film and post bump onto the surface of a wiring line exposed from an opening formed in a passivation film.

SUMMARY

A bonding pad (electrode pad) formed on a semiconductor chip is covered with a passivation film. Therefore, in case of coupling a conductive member (e.g., bump electrode or wire) to the bonding pad, an opening is formed in the passivation film and the conductive member is coupled through the opening to an exposed portion (surface, exposed surface, coupling portion) of the bonding pad which is exposed from the said opening. In this case, the passivation film is an insulating film, so when coupling the conductive member to the bonding pad, it is necessary to dispose the conductive member positively within the opening.

However, if the bonding pad is exposed to a greater extent than necessary, the bonding pad is apt to corrode in the exposed region. Therefore, the opening is usually formed smaller than the bonding pad. Thus, a high alignment accuracy is required when coupling the conductive member to the bonding pad.

In recent years, in view of the above-mentioned point, studies have been made about forming an electrode layer on an exposed portion of a bonding pad and coupling a conductive member to the electrode layer. In this case, the electrode layer is formed from the exposed portion of the bonding pad up to over an end portion (a peripheral portion of an opening) of a passivation film. Therefore, even if a conductive member is disposed on an end portion of the passivation film, it is possible to suppress a lowering of electrical coupling reliability between the conductive member and the bonding pad because the electrode layer connected electrically with the bonding pad is formed on the end portion of the passivation film. That is, by forming the electrode layer, it becomes easier to effect alignment of the conductive member with respect to the exposed portion of the bonding pad.

However, in the electrode layer in question there occurs a stepped portion corresponding to the thickness of the passivation film. Consequently, if a part of the conductive member is disposed on an end portion of the passivation film (if the conductive member is disposed so as to straddle a stepped portion), stress is concentrated on the stepped portion upon application of a load. As a result, if the spacing between the stepped portion and an end portion of the bonding pad is small, a crack is developed in a portion of the passivation film which portion covers a side face of the bonding pad. This has become clear through studies made by the present inventors. Particularly, as a result of studies made by the present inventors it turned out that a smaller thickness of the passivation film with advance of the semiconductor micromachining process was one cause of the aforesaid cracking.

Thickening the passivation film may be a countermeasure to the cracking of the passivation film. However, if the passivation film is made thicker, the depth of the opening formed in the passivation film also becomes larger and so does the stepped portion of the electrode layer which is formed from the interior of the opening up to over an end portion of the passivation film. Another method may be polishing (grinding) the passivation film formed thick to diminish the stepped portion in the vicinity of the opening in the passivation film. In this case, however, it becomes necessary to provide a larger number of manufacturing steps.

It is an object of the present invention to provide a technique which, in a semiconductor device with a conductive member coupled to the surface of a bonding pad, the bonding pad being exposed from an opening formed in a passivation film, can suppress cracking in a passivation film.

The above and other objects and novel features of the present invention will become apparent from the following description and the accompanying drawings.

Of the inventions disclosed herein, typical ones will be described below briefly.

A method of manufacturing a semiconductor device according to a typical mode includes a step (a) of providing a base member having a lead. Then, (b) a semiconductor chip is disposed on the base member, the semiconductor chip including a first main surface, a bonding pad formed over the first main surface, an insulating film formed over the first main surface such that a peripheral portion of the bonding pad is covered with the insulating film, an electrode layer electrically connected with a coupling portion of the bonding pad exposed from an opening formed in the insulating film, and formed over the insulating film and a second main surface opposite to the first main surface, thereafter, the bonding pad and the lead are connected together electrically via a conductive member and the electrode layer. The condition that, in a plan view, the distance between an end portion of the electrode layer and an end portion of the bonding pad is larger than distance between the end portion of the electrode layer and an end portion of the opening formed in the insulating film.

A method of manufacturing a semiconductor device according to another typical mode includes a step (a) of providing a base member having a lead. Then, (b) a semiconductor chip is disposed over the base member, the semiconductor chip including a first main surface, a bonding pad formed over the first main surface, an insulating film formed over the first main surface such that a peripheral portion of the bonding pad is covered with the insulating film, an electrode layer electrically connected with a coupling portion of the bonding pad exposed from an opening formed in the insulating film, and formed over the insulating film, and a second main surface opposite to the first main surface, thereafter, the bonding pad and the lead are connected together electrically via a conductive member and the electrode layer. In a plan view, the electrode layer includes a first portion overlapping the coupling portion and a second portion overlapping the insulating film in an area where the coupling portion is not formed, the area of the second portion being larger than that of the first portion, and the conductive member is coupled at the second portion of the electrode layer.

The following is a brief description of an effect obtained by the typical inventions out of those disclosed herein.

In a semiconductor device in which a conductive member is coupled to the surface of a bonding pad exposed from an opening formed in a passivation film, it is possible to suppress cracking in the passivation film.

DETAILED DESCRIPTION

Figure 1:
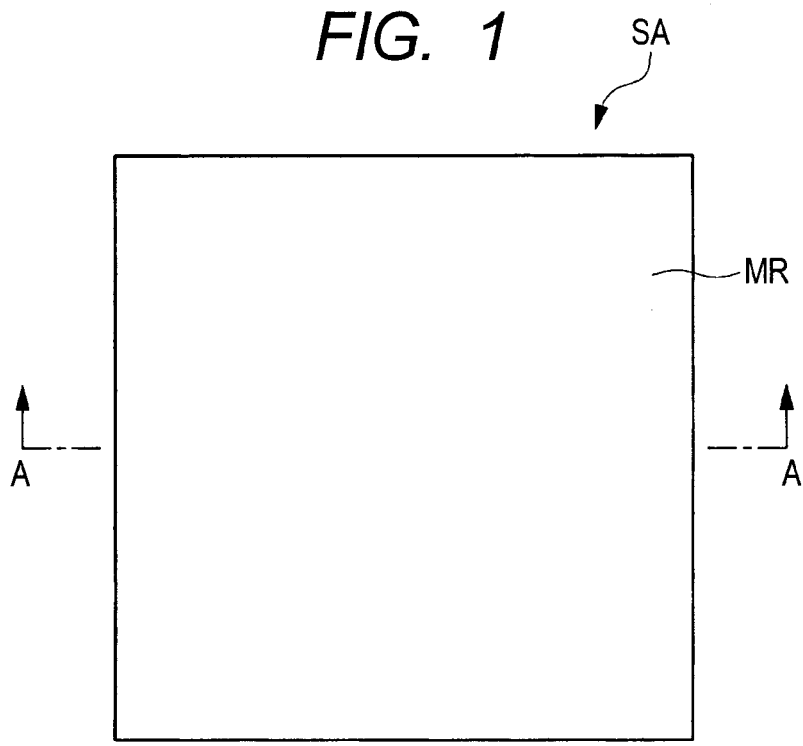
FIG. 1 is a plan view of a semiconductor device according to a first embodiment of the present invention as seen from an upper surface side thereof.

Where required for convenience' sake, the following embodiments will each be described dividedly into plural sections or embodiments, but unless otherwise specified, they are not unrelated to each other, but are in a relation such that one is a modification or a detailed or supplementary explanation of part or the whole of the other.

In the following embodiments, when reference is made to the number of elements (including the number, numerical value, quantity and range), no limitation is made to the number referred to, but numerals above and below the number referred to will do as well unless otherwise specified and except the case where it is basically evident that limitation is made to the number referred to.

Further, it goes without saying that in the following embodiments their constituent elements (including constituent steps) are not always essential unless otherwise specified and except the case where they are considered essentially basically obviously.

Likewise, it is to be understood that when reference is made to the shapes and a positional relation of constituent elements in the following embodiments, those substantially closely similar to or resembling such shapes, etc. are also included unless otherwise specified and except the case where a negative answer is evident basically. This is also true of the foregoing numerical value and range.

Moreover, in all of the drawings for illustrating the following embodiments, the same members are identified by the same reference numerals in principle, and repeated explanations thereof will be omitted. Even a plan view may be hatched in order to make it easier to see.

First Embodiment

<Configuration of Semiconductor Device>

A semiconductor device comprises a semiconductor chip, the semiconductor chip having semiconductor elements such as MISFETs (Metal Insulator Semiconductor Field Effect Transistors) and multi-layer interconnections, and a package formed so as to cover the semiconductor chip. The package has (1) a function of connecting the semiconductor elements formed on the semiconductor chip electrically with external circuits and (2) a function of protecting the semiconductor chip from external environment conditions such as humidity and temperature and preventing breakage caused by vibration or shock and preventing deterioration in characteristics of the semiconductor chip. The package further has (3) a function of facilitating handling of the semiconductor chip and (4) a function of dissipating heat generated from the semiconductor chip in operation and allowing the semiconductor elements to fulfill function to the utmost extent. There are various types of packages having such functions. A description will be given below about package configuration examples.

First, the configuration of the semiconductor device according to this first embodiment will be described with reference to drawings.

FIG. 1 is a plan view of the semiconductor device SA according to this first embodiment as seen from an upper surface side thereof. As shown in FIG. 1, the semiconductor device SA according to the first embodiment is quadrangular in shape and an upper surface thereof is covered with resin (sealing body) MR.

Figure 2:
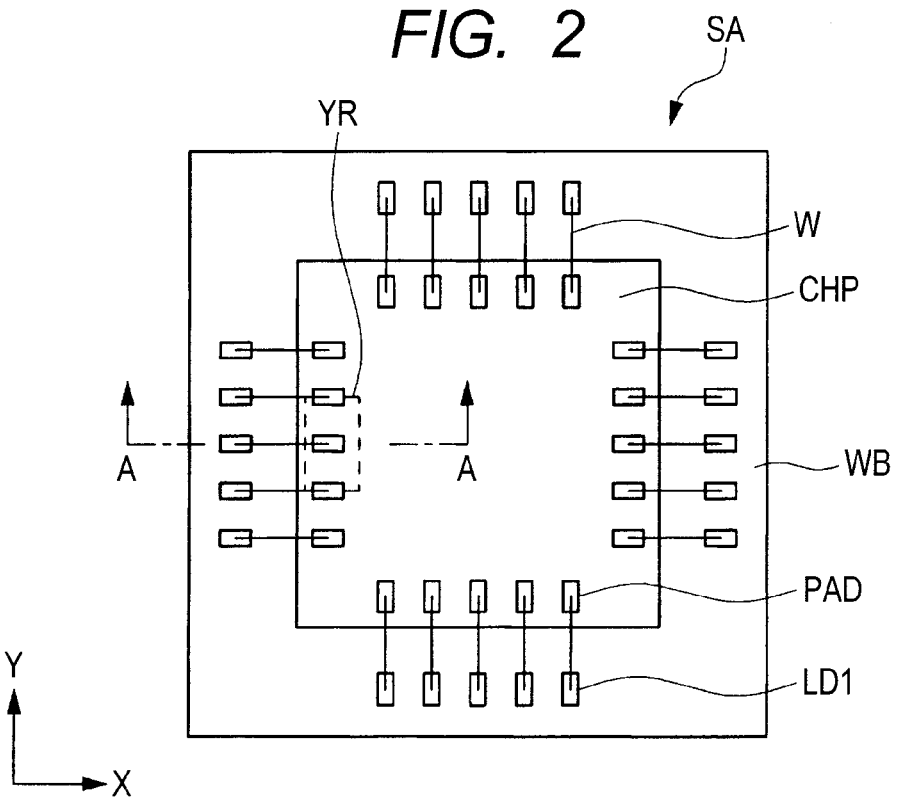
FIG. 2 is a diagram showing the semiconductor device as seen from the upper surface side thereof through resin.

FIG. 2 is a diagram of the semiconductor device SA as seen from the upper surface side thereof through resin MR. As shown in FIG. 2, a quadrangular wiring board WB is present in the interior of the semiconductor device SA when seen through resin MR. A semiconductor chip CHP is disposed on the wiring board WB. The semiconductor chip CHP is also quadrangular in shape. The size of the semiconductor chip CHP is a little smaller than that of the wiring board WB and the semiconductor chip CHP is disposed so as to be planarly included in the wiring board WB. Particularly, the semiconductor chip CHP is disposed so that the four sides thereof are parallel with the four sides respectively of the wiring board WB.

An integrated circuit is formed on the semiconductor chip CHP. More specifically, plural semiconductor elements such as MISFETs are formed on a semiconductor substrate which configures the semiconductor chip CHP. Multi-layer interconnections are formed in an upper layer of the semiconductor substrate through interlayer dielectric films and are connected electrically with plural MISFETs formed on the semiconductor substrate to configure an integrated circuit. That is, the semiconductor chip CHP has a semiconductor substrate with plural MISFETs formed thereon and multi-layer interconnections formed in the upper layer of the semiconductor substrate. Thus, in the semiconductor chip CHP is formed an integrated circuit by plural MISFETs and multi-layer interconnections. For interfacing between the integrated circuit and external circuits there are formed pads (bonding pads, electrode pads) PAD on the semiconductor chip CHP. The pads PAD are formed by partially exposing uppermost-layer wiring lines formed in uppermost layers of the multi-layer interconnections.

Plural pads PAD are formed on a main surface (surface, upper surface) of the semiconductor chip CHP. More specifically, plural pads PAD are formed along each of the four sides of the quadrangular semiconductor chip CHP. Likewise, plural leads (bonding leads, electrodes) LD1 are formed along each of the four sides of the wiring board WB so as to confront the pads PAD respectively formed on the semiconductor chip CHP. The pads PAD formed on the semiconductor chip are electrically connected, each through a conductive member with the leads LD1 formed on the wiring board WB. The conductive member used in this embodiment is, for example, a wire W formed of gold (Au).

Figure 3:
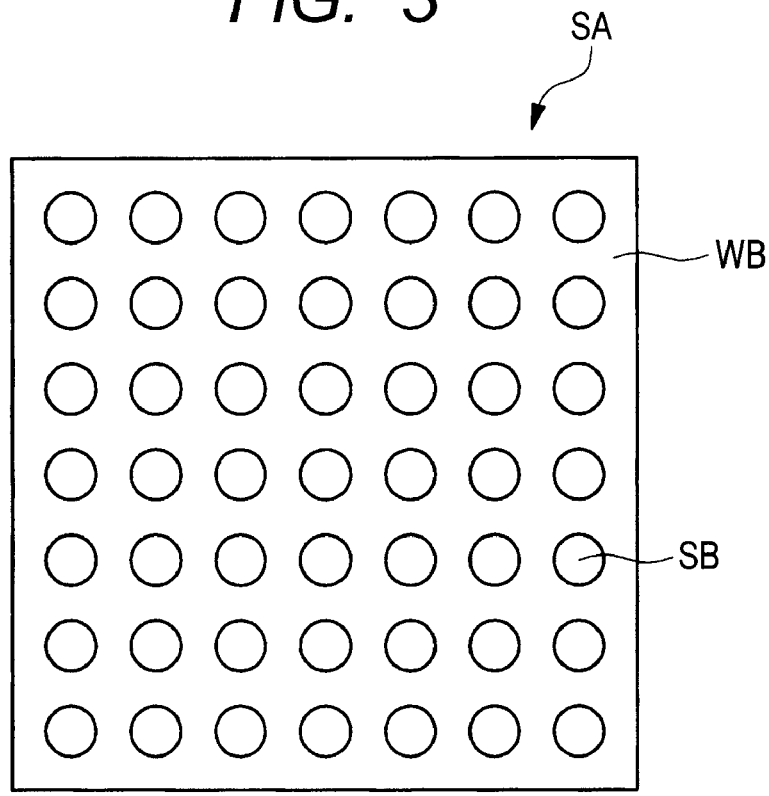
FIG. 3 is a diagram showing the semiconductor device of the first embodiment as seen from a back surface side thereof.

FIG. 3 is a diagram showing the semiconductor device SA according to this first embodiment as seen from a back surface side thereof. As shown in FIG. 3, plural solder balls SB are arranged in the form of an array (matrix) on the back surface of the semiconductor device SA. The solder balls SB function as external coupling terminals of the semiconductor device SA.

Figure 4:
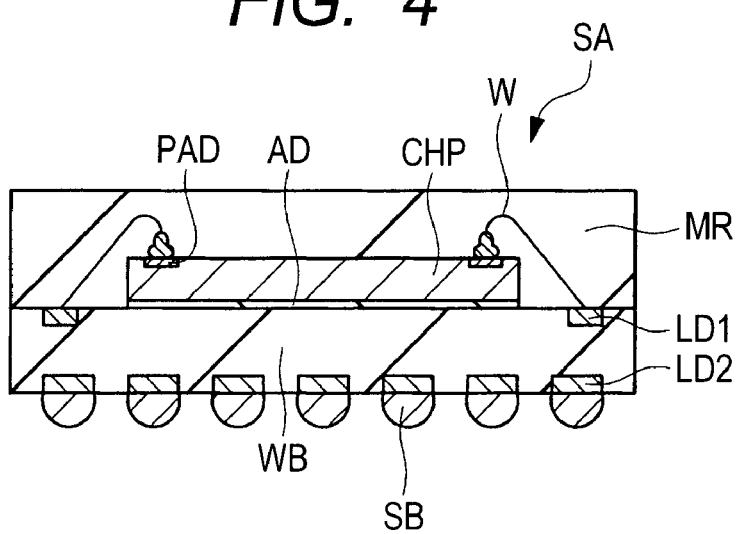
FIG. 4 is a sectional view taken on line A-A in FIG. 1.

FIG. 4 is a sectional view taken on line A-A in FIG. 1. In FIG. 4, leads LD1 are formed on an upper surface of the wiring board WB, while leads (bump lands, electrodes) LD2 are formed on a lower surface of the wiring board WB. Multi-layer interconnections and via holes are formed in the interior of the wiring board WB, and the leads LD1 formed on the upper surface of the wiring board WB and the leads LD2 formed on the lower surface of the wiring board WB are connected together electrically through multi-layer interconnections formed in the interior of the wiring board WB and via wiring lines formed within the via holes. The leads LD2 formed on the lower surface of the wiring board WB are arranged in the shape of an array, with solder balls SB being mounted on the leads LD2 respectively. Thus, the solder balls SB coupled with the leads LD2 are arranged array-like on the back surface (lower surface) of the wiring board WB.

The semiconductor chip CHP is mounted on the upper surface (surface) of the wiring board WB and it is bonded to the wiring board WB through an insulating adhesive AD. The pads PAD formed on the main surface of the semiconductor chip CHP and the leads LD1 formed on the upper surface of the wiring board WB are coupled together through wires W. Further, resin (sealing body) MR is formed on the upper surface of the wiring board WB so as to cover the semiconductor chip CHP and the wires W. According to the semiconductor device SA thus configured, the pads PAD formed on the semiconductor chip CHP are coupled through wires W to the leads LD1 formed on the wiring board WB, and the leads LD1 are electrically connected, through wiring lines (not shown) and via wiring lines (also not shown) formed in the interior of the wiring board WB, to the leads LD2 formed on the back surface of the wiring board WB. Thus, it is seen that the integrated circuit formed in the semiconductor chip CHP is finally coupled to the semiconductor balls SB through the route of pads PAD→wires W→leads LD1→leads→solder balls SB. Accordingly, it is seen that the integrated circuit formed in the semiconductor chip CHP and an external circuit can be connected together by coupling the external circuit electrically to the solder balls SB.

The semiconductor device SA described above is of a BGA (Ball Grid Array) type as a package type, but the package type of the semiconductor device SA in the present invention is not limited thereto. For example, although in the above example the semiconductor chip CHP and the wiring board WB are coupled together through wires, the present invention is applicable also to flip-chip mounting in which the two are coupled together through bump electrodes. The present invention is further applicable to a package type which uses not the wiring board WB but a lead frame as a base member for mounting the semiconductor chip CHP thereon.

Therefore, the member for mounting the semiconductor chip CHP thereon is designated a base member in a wide concept and the wiring board WB and a lead frame are included in the concept of the base member. The portion of the base member on which the semiconductor chip CHP is mounted is designated a chip mounting portion and a die pad is included in the concept of the chip mounting portion. Moreover, electrodes formed on the base member so as to be coupled with the semiconductor chip CHP are designated leads. Further, the present invention includes a form of using wires W and bump electrodes for coupling between the pads PAD of the semiconductor chip CHP and the leads of the base member, therefore, a broad concept including such wires and bump electrodes is designated a conductive member.

<Structure of Pad in Conventional Semiconductor Chip>

Figure 5:
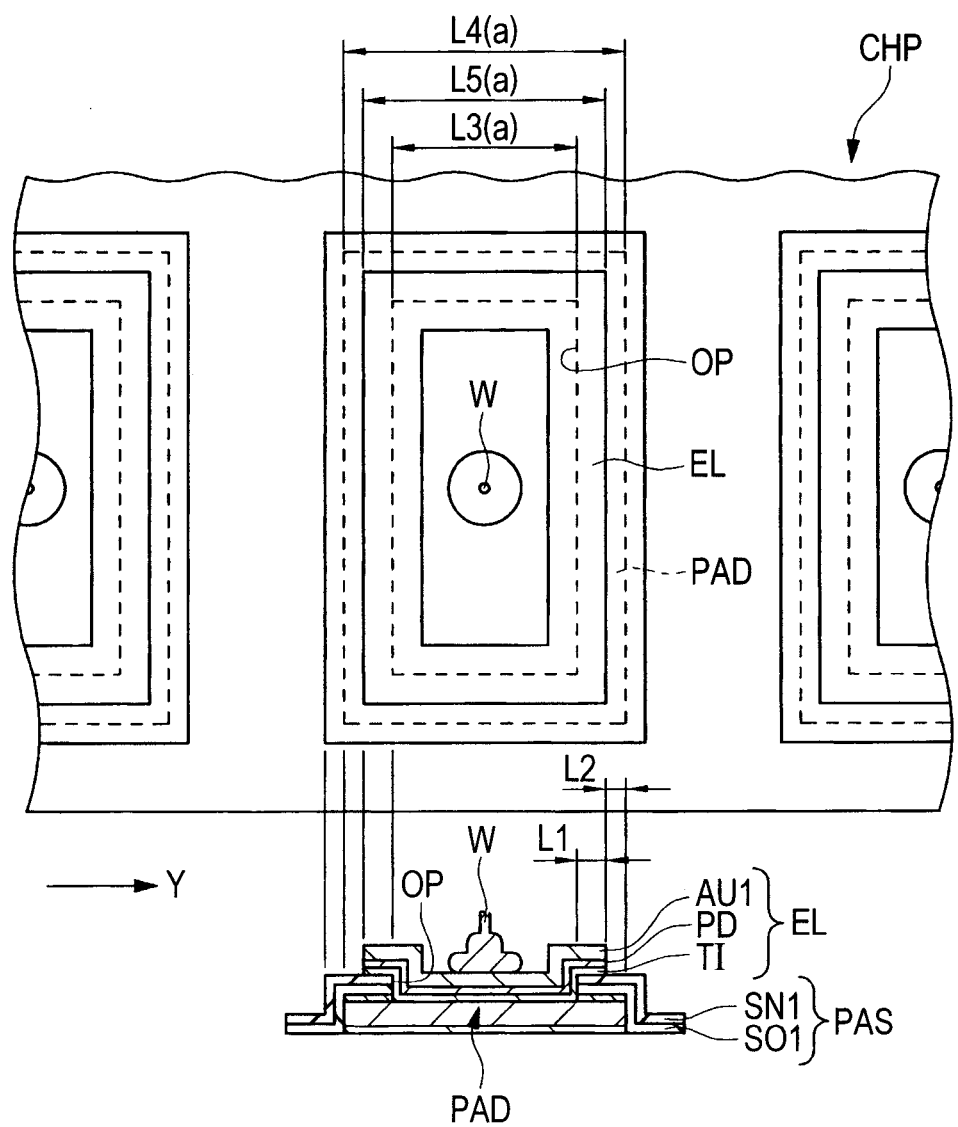
FIG. 5 is an enlarged diagram of a partial area in FIG. 2, showing a conventional technique.

Next, a description will be given about the structure near each pad PAD in a conventional semiconductor chip CHP. FIG. 5 shows an area YR in FIG. 2 on a larger scale. In FIG. 5 three pads PAD arranged in Y direction are shown on an upper side of the same figure, while a sectional view corresponding to a plan view of each pad PAD is shown on a lower side of the same figure. First, a description will be given about the structure near each pad PAD with reference to the sectional view shown on the lower side of FIG. 5. In the same figure, a passivation film (a surface protecting film) PAS is formed so as to cover a pad PAD, a part of the passivation film PAS being removed to form an opening OP to which is exposed a part of the pad PAD. An electrode layer EL is formed so as to extend from the interior of the opening OP (in other words, an exposed portion of the pad PAD) and overhang end portions (environs of the opening OP) of the passivation film PAS, with a wire W being coupled to the electrode layer EL. In this case, the passivation film PAS is formed by a laminate of both silicon oxide film SO1 and silicon nitride film SN1, and the electrode layer EL is formed by a laminate of titanium film T1, palladium film PD and gold film AU1.

As shown in the upper, plan view in FIG. 5, given that the width in Y direction of a pad PAD is L4(*a*), the width in Y direction of the electrode layer EL is L5(*a*) and the width in Y direction of an opening OP is L3(*a*), there exists a relation of L4(*a*)>L5(*a*)>L3(*a*). That is, the electrode layer EL is formed so as to be planarly included in (i.e., have a footprint within) the pad PAD and the opening OP is formed so as to be planarly included in the electrode layer EL. In the conventional semiconductor chip CHP thus configured, as shown in FIG. 5, given that a planar distance between one end of the electrode layer EL and one end of the opening OP is L1 and a planar distance between one end of the electrode layer EL and one end of the opening OP is L2, there exists a relation of L1>L2. That is, the planar distance (L2) between one end of the electrode layer EL and one end of the pad PAD is shorter than the planar distance (L1) between one end of the electrode layer EL and one end of the opening OP. In this connection, the present inventors have newly found out that in a wire bonding step of forming a wire W on the electrode layer EL, a crack is developed at each of stepped portions of the passivation film PAS covering end portions of the pad PAD.

<Problem in the Conventional Semiconductor Chip>

Figure 6A:
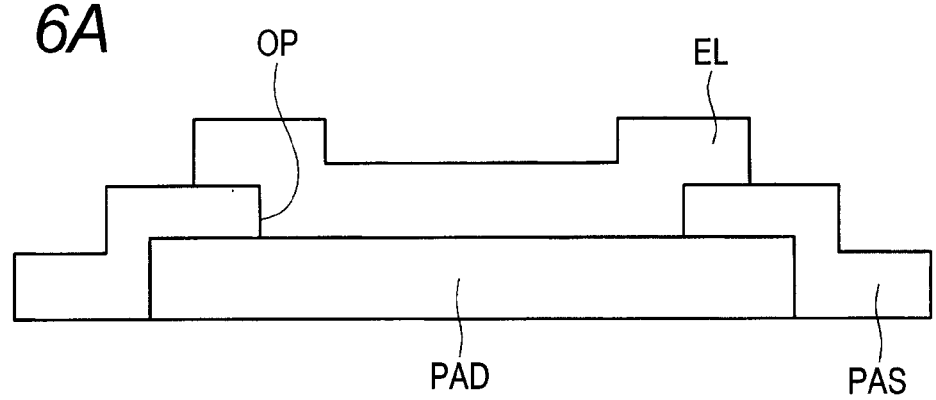
FIGS. 6(a) to 6(c) are diagrams explaining a problem of the conventional technique.
Figure 6B:
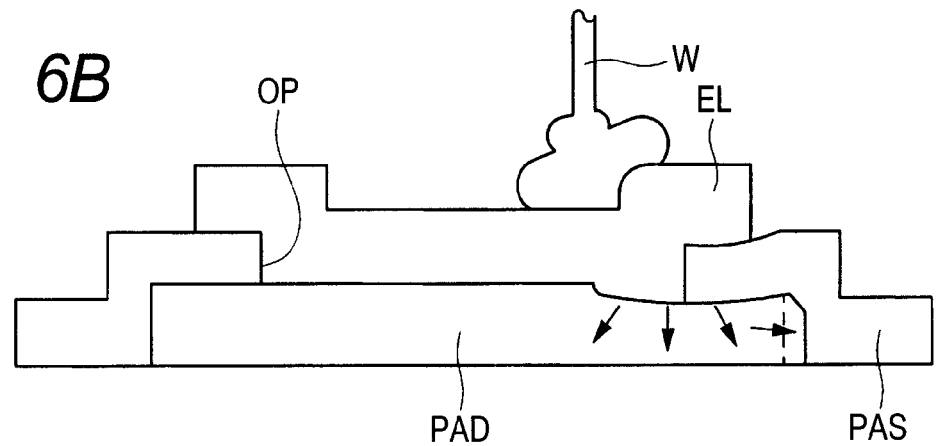
Figure 6C:
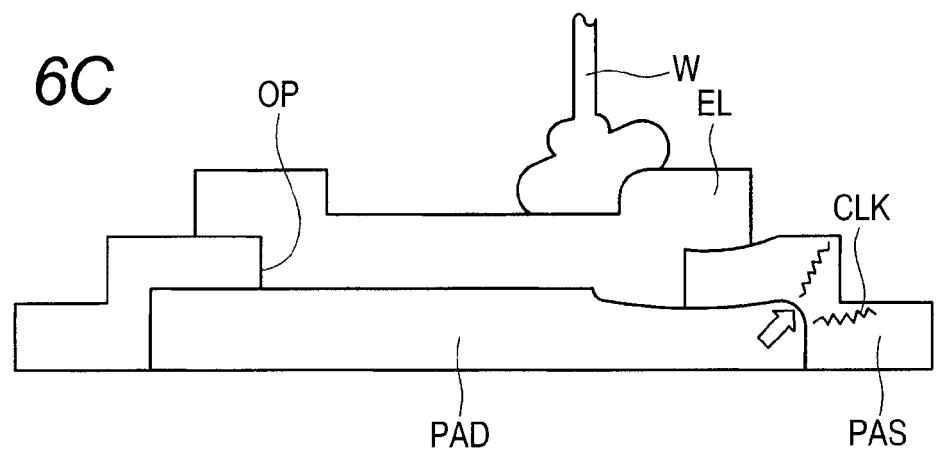

A problem involved in the conventional semiconductor chip CHP will now be described with reference to FIGS. 6(*a*) to 6(*c*). A wire bonding step will be described with reference to FIGS. 6(*a*) to 6(*c*). First, as shown in FIG. 6(*a*), a passivation film PAS is formed so as to cover a pad PAD and there is formed an opening OP which opens a part of the passivation film PAS. Further, an electrode layer EL is formed from the interior of the opening OP (in other words, an exposed portion of the pad PAD) so as to overhang end portions of the passivation film (environs of the opening OP). A wire W is coupled onto the electrode layer EL thus configured.

In a wire bonding step shown in FIG. 6(*b*), the wire W is coupled onto the electrode layer EL with use of a capillary. In this case, a coupled position of the wire W may be deviated to an end side from the center of (misaligned from) the electrode layer EL due to reduction in size of the electrode layer EL and depending on the accuracy of wire bonding. Since the electrode layer EL is formed so as to overhang the passivation film PAS from the interior of the opening OP, there are formed stepped portions near end portions of the electrode layer EL reflecting the difference in height attributable to the opening OP. Therefore, if the coupled position of the wire W deviates to an end side of the electrode layer EL, the wire W is coupled onto the stepped portion formed near the end portion of the electrode layer EL. In the wire bonding step, the wire W is coupled using both load and ultrasonic wave, so that the load applied is imposed on the stepped portion of the electrode layer EL. The load thus imposed on the stepped portion of the electrode layer EL is transmitted as stress to the underlying pad PAD. As a result, the pad PAD is deformed as shown in FIG. 6(*b*). Particularly, a strong stress is applied in a direction to thereby stretch an end portion of the pad PAD.

In this case, with the strong stress imposed on the end portion of the pad PAD, a strong stress is applied to the passivation film PAS which covers the end portion of the pad PAD. That is, since the passivation film PAS is formed so as to cover the end portions of the pad PAD, stepped portions are formed in the passivation film PAS covering the end portions of the pad PAD and a strong stress induced by the deformation of the pad PAD is applied to the stepped portion concerned. Consequently, a crack is developed in the stepped portion of the passivation film PAS.

Particularly, in the conventional semiconductor chip CHP, as noted above, the distance (L2) between one end of the electrode layer EL and one end of the pad PAD is very short. In other words, the distance (L2) is shorter than the planar distance (L1) between one end of the electrode layer EL and one end of the opening OP. This means that the end portion of the electrode layer EL, to which the wire W is coupled deviatedly, is close to the stepped portion of the passivation film PAS covering the end portion concerned of the pad PAD. That is, the end portion of the electrode layer EL is pushed by the load induced in wire bonding, with consequent deformation of the pad PAD, but if the end portion of the electrode layer EL is close to the stepped portion of the passivation film PAS, the stress applied to the stepped portion of the passivation film PAS becomes large. In recent years, with advance of the semiconductor micromachining process, the thickness of the passivation film PAS also tends to become smaller. Therefore, in the case where the wire W is coupled deviatedly to an end side of the electrode layer EL, a crack CLK may develop in the associated stepped portion of the passivation film PAS covering end portions of the pad PAD. If the crack CLK is formed in the passivation film PAS, there arises the problem that water or the like gets into the inside through the crack CLK, causing corrosion of the pad PAD.

<Feature of the Technical Idea in the First Embodiment>

In this first embodiment there is made improvement for solving the above-mentioned problem which occurs in the conventional semiconductor chip CHP. A feature of the first embodiment will now be described. According to the first embodiment there is provided a technique which, on the premise that there is a case where the position of wire W is deviated to an end side of the electrode layer EL, suppresses the occurrence of a crack CLK in the passivation film PAS even when the wire position is deviated to an end side of the electrode layer EL. That is, the technical idea of the first embodiment does not attempt to prevent a positional deviation of the wire W coupled to the electrode layer EL, but still can suppress the occurrence of a crack CLK in the passivation film PAS even when the position of wire W coupled to the electrode layer EL is deviated to an end side of the electrode layer.

First, having studied how a crack CLK is developed in the passivation film PAS in the conventional semiconductor chip CHP, the present inventors found out that a shorter planar distance (L2) between one end of the electrode layer EL and one end of the pad PAD than the planar distance (L1) between one end of the electrode layer EL and one end of the opening OP was a main cause. On the basis of this finding, the present inventors hit upon a technical idea of making the planar distance (L2) between one end of the electrode layer EL and one end of the pad PAD longer than the planar distance (L1) between one end of the electrode layer EL and one end of the opening OP. That is, the first embodiment is characteristic in that the planar distance (L2) between one end of the electrode layer EL and one end of the pad PAD is made longer than the planar distance (L1) between one end of the electrode layer EL and one end of the opening OP. Consequently, even in the event of deviation of the coupled position of wire W to an end side of the electrode layer EL, since the planar distance (L2) between one end of the electrode layer EL and one end of the pad PAD is the longer, the transfer of stress, which is induced by coupling of wire W to a stepped portion of the electrode layer EL, up to an end portion of the pad PAD can be suppressed. As a result, deformation of the pad PAD at an end portion thereof is diminished and it is possible to reduce stress transmitted to a stepped portion of the passivation film PAS which covers the end portion of the pad PAD. Once the stress applied to the stepped portion of the passivation film PAS is reduced, it is possible to suppress the occurrence of a crack CLK which results from a large stress. Thus, according to this first embodiment, even when the position of wire W coupled to the electrode layer EL is deviated, it is possible to suppress the occurrence of a crack CLK in the passivation film PAS and hence possible to obtain an outstanding and unexpected result that the reliability of the semiconductor device SA in the first embodiment can be improved.

Particularly, with the passivation film PAS thinner than the pad PAD, it becomes more likely that a crack CLK will be developed in the passivation film PAS, but by adopting the technical idea in the first embodiment, it is possible to suppress the occurrence of a crack CLK in the passivation film PAS even when the passivation film PAS is thinner than the pad PAD. This means that by adopting the technical idea in the first embodiment it becomes unnecessary to thicken the passivation film PAS because the crack CLK cannot easily develop. For example, a thicker passivation film PAS allows easier occurrence of warp of the semiconductor chip CHP, but since it is possible to suppress the occurrence of a crack CLK in the passivation film PAS without thickening the passivation film PAS, there also is obtained an effect that the warp of the semiconductor chip CHP can be suppressed indirectly. The following description is now provided about various configurations which embody the feature of the first embodiment.

<Embodying Approach 1 (Small Opening OP)>

Figure 7:
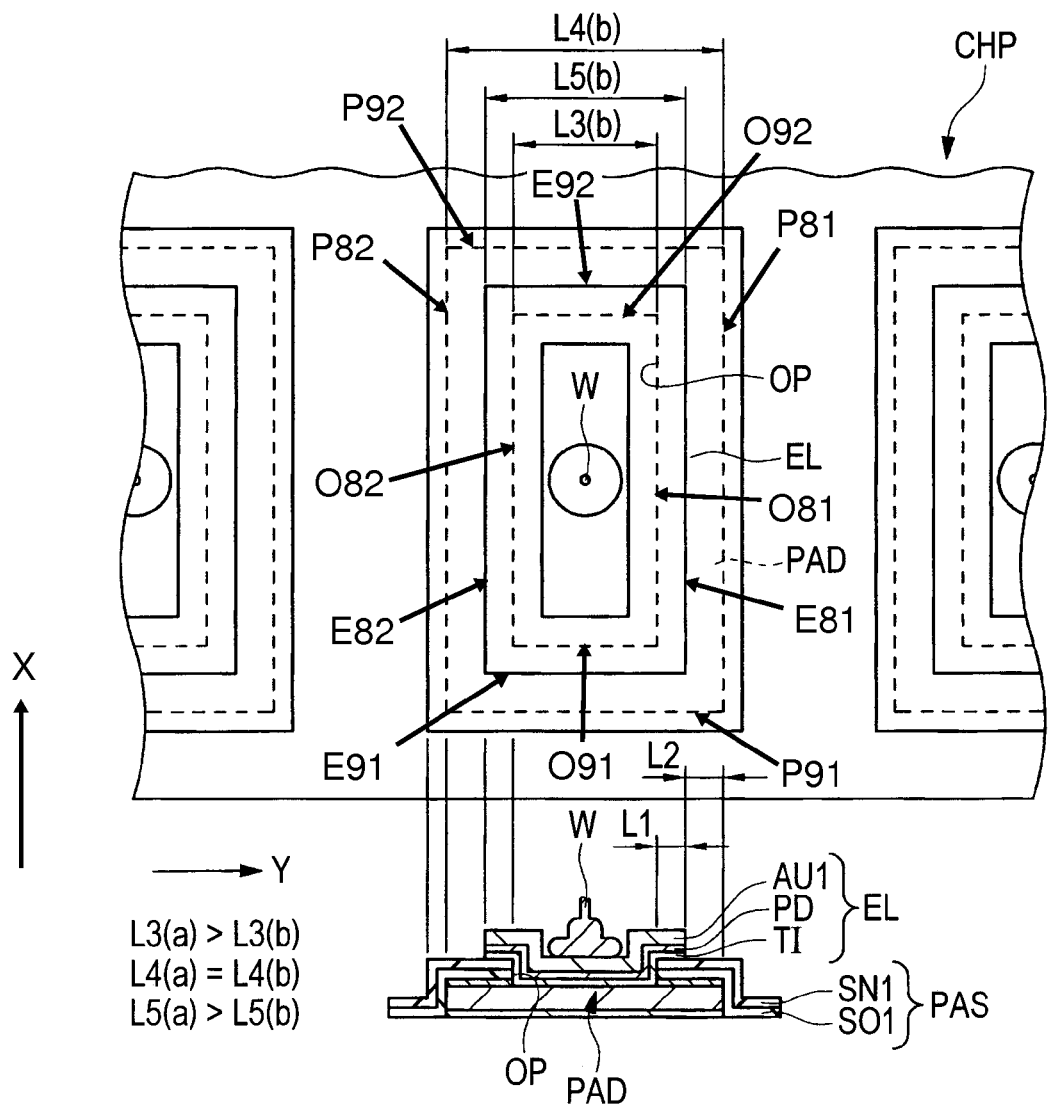
FIG. 7 is an enlarged diagram of a partial area in FIG. 2, embodying the technical idea of the first embodiment.

FIG. 7 is an enlarged diagram of an area YR in FIG. 2 in connection with the semiconductor chip CHP used in this first embodiment. In FIG. 7, three pads PAD arranged in Y direction are shown on an upper side, while a sectional view corresponding to a plan view of a pad PAD is shown on a lower side. First, the structure near the pad PAD will be described using the lower, sectional view in FIG. 7. In FIG. 7, a passivation film (surface protecting film) PAS is formed on a main surface (surface, upper surface) of a semiconductor chip CHP so as to cover a peripheral portion of a surface (upper surface) of the PAD. In other words, a part of the passivation film PAS is removed and a part (exposed portion, coupling portion) of the pad PAD is exposed from an opening OP formed in the passivation film PAS. An electrode layer EL is formed so as to overhang the passivation film PAS from the interior of the opening OP, with a wire W being coupled to the electrode layer EL. The pad PAD is formed by a laminate of titanium nitride film, aluminum film and titanium nitride film, and the passivation film PAS is formed by an insulating film. In this first embodiment the passivation film PAS is formed by a laminate of silicon oxide film SO1 and silicon nitride film SN1. Further, the electrode layer EL1 is formed by a laminate of titanium film TI, palladium film PD and gold film AU1. The thickness of the passivation film PAS is smaller than that of the pad PAD.

In this first embodiment, as shown in FIG. 7, the wire W is not directly coupled to the pad PAD, but the electrode layer EL is formed on the pad PAD and then the electrode layer EL and the wire W are coupled together. That is, in the ordinary semiconductor device it is considered general to couple the wire W directly to the pad PAD, but in this first embodiment the electrode layer EL is formed on the pad PAD and then the electrode layer EL and the wire W are coupled together. This is for the following reason.

As noted above, the pad PAD is formed by a laminate of titanium nitride film, aluminum film and titanium nitride film, but at the surface of the pad PAD exposed due to the opening OP, the titanium nitride film is removed and aluminum film is exposed. On the other hand, the wire W is formed by a gold wire for example. Therefore, in case the pad PAD comes into direct contact with the wire W, the aluminum film which constitutes the pad PAD and the gold film which constitutes the wire W come into contact with each other. In this case, an alloy film of gold and aluminum is formed in the area of contact between the pad PAD and the wire W. It is known that if a high-temperature load is imposed on the gold-aluminum alloy film, voids are created in the interior of the film, resulting in breakage of the film. This phenomenon is called Kirkendall void, and in case of using the semiconductor device in a high-temperature application, there occurs an increase in contact resistance between the pad PAD and the wire W and also an increase in likelihood of a break between the pad PAD and the wire W, due to the said phenomenon, thus leading to the problem that the reliability of the semiconductor device is deteriorated.

Therefore, in case of using the semiconductor device in such a severe condition as a high temperature condition, there usually is adopted a method in which the pad PAD is not brought into contact with the wire W directly, but instead an electrode layer EL is formed on the pad PAD and then the electrode layer EL and the wire W are coupled together. In this case, the electrode layer EL is formed, for example, by a laminate of titanium film TI, palladium film PD and gold film AU1. The titanium film TI functions as a barrier film which interrupts movement of metal atoms and the palladium film PD functions to improve the adhesive strength between the gold film AU1 and the titanium film TI. Further, the gold film AU1 formed as a top layer in the electrode layer EL is used for improving the adhesive strength for the wire W which is also formed by gold film. That is, in case of both films being gold films, it is possible to improve the adhesive strength. Although the aluminum (Al) film is poor in corrosion resistance, since the gold film AU1 is superior in corrosion resistance, the coupling reliability between the conductive member (here the wire W) and the pad PAD can also be ensured by covering with the electrode layer EL the exposed portion (surface, exposed surface, coupling portion) of the pad PAD exposed from the opening OP of the passivation film PAS.

In case of coupling the electrode layer EL thus configured with the wire W, since gold films are bonded together, there does not occur the problem of Kirkendall void that occurs in case of an alloy film of aluminum and gold being formed. Thus, the reliability of the semiconductor device SA can be improved even when the semiconductor device SA is used in a high temperature condition. That is, in the semiconductor device SA according to this first embodiment, the electrode layer EL is provided for improving the reliability of the semiconductor device in a high temperature application and the technical idea in this first embodiment embraces the provision of the electrode layer EL on the pad PAD and subsequent coupling of the electrode layer EL to the wire W.

A detailed description will now be given about embodying approach 1. As shown in the upper, plan view in FIG. 7, given that the width in Y direction of the pad PAD is L4($b$), the width in Y direction of the electrode layer EL is L5($b$), and the width in Y direction of the opening OP is L3($b$), there exists a relation of L4($b$)>L5($b$)>L3($b$). That is, the electrode layer EL is formed so as to be planarly included in the pad PAD and the opening OP is formed so as to be planarly included in the electrode layer EL. Thus, in the embodiment shown, in the plan view, the smallest footprint of the opening OP falls entirely within the medium-sized footprint of electrode layer EL which, in turn, falls entirely within the largest footprint of the pad PAD.

In the thus-configured semiconductor chip CHP used in this first embodiment, as shown in FIG. 7, given that a first planar distance between a first end E81 of the electrode layer EL and a first end O81 of the opening OP is L1 and a second planar distance between the first end E81 of the electrode EL and a first end P82 of the pad PAD is L2, there exists a relation of L1<L2. That is, the second planar distance (L2) between a first end E81 of the electrode layer EL and a first end P81 of the pad PAD is longer than the first planar distance (L1) between the first end E81 of the electrode layer EL and a first end O81 of the opening OP and thus the feature (L1<L2) in this first embodiment is realized.

In this embodying approach 1 of FIG. 7, L2 may be greater than L1 by anywhere from 10% to 50%, though it may exceed L1 by other amounts as well.

More specifically, if a comparison is made between FIG. 5 showing the prior art and FIG. 7 related to the first embodiment, it is seen that the width L4($a$) in Y direction of the pad PAD in the prior art and the width L4($b$) in Y direction of the pad PAD in this first embodiment are equal to each other (L4($a$)=L4($b$)). The prior art and the technical idea in this first embodiment are different in that the width L5($b$) in Y direction of the electrode layer EL in the first embodiment is smaller than the width L5($a$) in Y direction of the electrode layer EL in the prior art, (L5($a$)>L5($b$)), and that the width L3($b$) in Y direction of the opening OP in the first embodiment is smaller than the width L3($a$) in Y direction of the opening OP in the prior art, (L3($a$)>L3($b$)).

Thus, in the prior art there is established the condition of L1>L2, while in this first embodiment its feature L1<L2 is embodied. That is, according to the embodying approach 1 which embodies the feature of the first embodiment, the condition of L1<L2 is realized by making the diameter of the opening OP smaller than in the prior art. In other words, the embodying means 1 realizes the condition L1<L2 by reducing both the width L5($b$) in Y direction of the electrode layer EL and the width L3($b$) in Y direction of the opening OP while fixing the width L4($b$) in Y direction of the pad PAD.

Although in this first embodiment a description is given about the case where a planar shape of the pad PAD is rectangular, no limitation is made thereto. A planar shape of the pad PAD may be square if the above conditions (L4($b$)>L5($b$)>L3($b$), L1<L2) are satisfied on each of four sides. Thus, the footprints of the opening OP, the electrode layer EL and the pad PAD need not all be rectangular as seen in FIG. 7. In fact, it is possible for one of these to have a footprint that is shaped differently from the remaining two, and it is also possible that all three have different shaped footprints. What is important is the difference in overlap at the edges (ends) of their various footprints.

Figure 8:
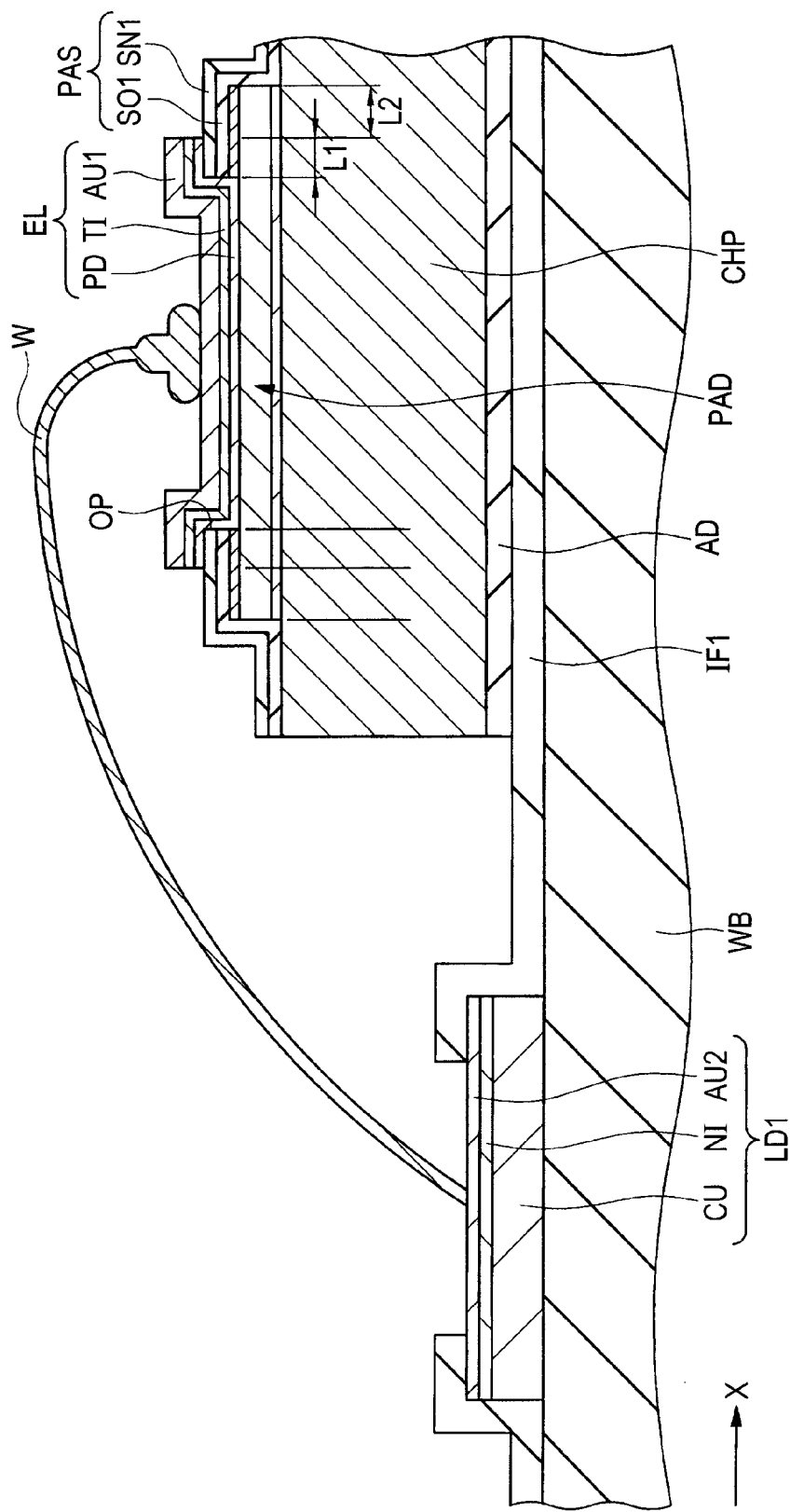
FIG. 8 is a sectional view taken on line A-A in FIG. 2, embodying the technical idea of the first embodiment.

FIG. 8 is a sectional view taken on line A-A in FIG. 2 in connection with the semiconductor chip CHP used in the first embodiment. In FIG. 8, a lead (bonding lead, electrode) LD1 is formed on a wiring board WB and an insulating film IF1 is formed on the wiring board WB so as to cover a peripheral portion of the surface of the lead LD1. In other words, an opening OP is formed in the insulating film IF1 and a part of the surface of the lead LD1 is exposed from the opening formed in the insulating film IF1. The lead LD1 is formed by a laminate of copper film CU, nickel film NI and gold film AU2.

Adjacent to the lead LD1 a semiconductor chip CHP is mounted on the wiring board WB through the insulating film IF1. The semiconductor chip CHP and the insulating film IF1 are bonded together through an insulating adhesive AD. A pad PAD is formed on the surface of the semiconductor chip CHP and a passivation film PAS is formed so as to cover the pad PAD. An opening OP is formed in the passivation film PAS and a part of the surface of the pad PAD is exposed to the bottom of the opening OP. Further, an electrode layer EL is formed so as to overhang an end portion (a peripheral portion of the opening OP) of the passivation film PAS from the interior of the opening OP (in other words, an exposed portion of the pad PAD). The electrode layer EL and the lead LD1 are coupled together through a wire W.

The pad PAD is formed by a laminate of titanium nitride film, aluminum film and titanium nitride film and the passivation film PAS is formed by a laminate of silicon oxide film SO1 and silicon nitride film SN1. The electrode layer EL is formed by a laminate of titanium film TI, palladium film PD and gold film AU1.

FIG. 8 is a sectional view taken on line A-A in FIG. 2, showing X direction orthogonal to Y direction (i.e., the X direction crosses the Y direction at right angles, in the plan view of FIG. 2). Also in FIG. 8, given that a first planar distance between one end of the electrode layer EL and one end of the opening OP is L1 and a second planar distance between one end of the electrode layer EL and one end of the pad PAD is L2, there exists a relation of L1<L2. That is, in this first embodiment, the relation of L1<L2 exists not only in Y direction shown in FIG. 7 but also in X direction shown in FIG. 8.

In this first embodiment, as shown in FIG. 7, the pad PAD, electrode layer EL and the opening OP formed in the passivation film PAS, are rectangular (an example of a quadrangular shape) and one side of the pad PAD, one side of the electrode layer EL and one side of the opening OP are parallel to one another, when seen in plan.

Moreover, as also shown in FIG. 7, in the Y direction, the pad PAD has opposing parallel first and second end portions P81, P82; the electrode layer EL has opposing parallel first and second end portions E81, E82 and the opening OP has opposing parallel first and second end portions O81, O82. Thus, in Y direction parallel to one side of the pad PAD, the second spacing between a second end portion E82 of the electrode layer EL and a second end portion P82 of the pad PAD is larger than the first spacing between the second end portion E82 of the electrode layer EL and a second end portion of the opening OP formed in the passivation film PAS. Further, as shown in FIG. 8, this also applies in the X direction orthogonal to the Y direction. In other words, in both the X and Y directions, the second spacing between an end portion of the electrode layer EL and an end portion of the pad PAD is larger than the first spacing between an end portion of the electrode layer EL and an end portion of the opening OP formed in the passivation film PAS. Thus, in this first embodiment, the relation of L1<L2 exists in both Y and X directions. It is understood, however, that the values of L1 and L2 in the X direction do not have to be exactly the same as the values of L1 and L2 in the Y direction, so long as the relationship L1<L2 holds in both directions.

Therefore, FIG. 7 shows the outer boundaries (i.e., the footprint) of the bonding pad PAD; the opening OP formed in the film, and the electrode layer EL. The bonding pad PAD has a first footprint defined by a first pair of parallel ends P81, P82 extending in the X direction which connect to a second pair of parallel ends P91, P92 extending in the Y direction (which is orthogonal to the X direction). The opening OP has a second footprint defined by a third pair of parallel ends O81, O82 extending in the X direction which connect to a fourth pair of parallel ends O91, O92 extending in the Y direction. Finally, the electrode layer EL has a third footprint defined by fifth pair of parallel ends E81, E82 extending in the X direction which connect to a sixth pair of parallel ends E91, E92 extending in the Y direction.

In the Y direction, the first spacing (L1) between first ends E81 and O81 belonging to the fifth pair and third pair, respectively, is less than the second spacing (L2) between first ends E81 and P81 belonging to the fifth pair and first pair, respectively. Also, the first spacing between second ends E82 and O82 belonging to the fifth pair and third pair, respectively, is less than the second spacing between second ends E82 and P82 belong to the fifth pair and first pair, respectively.

In the X direction, in a similar manner, a first spacing between first ends E91 and O91 is less than a second spacing between first ends E91 and P91. Also, a first spacing between second ends E92 and O92 is less than a second spacing between second ends E92 and P92.

Thus, in this first embodiment, even when the position of the wire W coupled to the electrode layer EL is deviated in Y direction, the characteristic condition (L1<L2) in this first embodiment exists in Y direction. In other words, even if the pad PAD is not formed larger in size than necessary, the planar distance (L2) between one end of the electrode layer EL and one end of the pad PAD can be made large, so that it is possible to prevent the occurrence of a crack CLK in the passivation film PAS. Further, even when the position of the wire W coupled to the electrode layer EL is deviated in X direction, it is possible to prevent the occurrence of a crack CLK in the passivation film PAS because there exists the characteristic condition (L1<L2) in this first embodiment.

That is, a deviating direction of the wire W coupled to the electrode layer EL is arbitrary, but according to this first embodiment there exists the characteristic condition (L1<L2) in both Y and X directions orthogonal to each other, so that even when the coupled position of the wire W deviates in an arbitrary direction, it is possible to suppress the occurrence of a crack CLK in the passivation film PAS and hence possible to improve the reliability of the semiconductor device SA in this first embodiment.

Thus, the embodying approach 1 used in this first embodiment satisfies the condition L1<L2 by reducing the width of the electrode layer EL and that of the opening OP while fixing the width of the pad PAD. An advantage of this embodying approach 1 resides in that the condition L1<L2 can be satisfied without enlarging the width of the pad PAD. For example, in a product in which pads PAD are arranged at a narrow pitch on a semiconductor chip CHP, it is difficult to enlarge the width of each pad PAD and therefore the embodying approach 1 which satisfies the condition L1<L2 by making small the width of the electrode layer EL and that of the opening OP is useful.

On the other hand, according to the embodying approach 1, since the width of the electrode layer EL and that of the opening OP are reduced, there may arise the necessity of making the wire W (ball) small in case of forming the wire W (ball) so as to be planarly included in (i.e., fall within the footprint of) the opening OP. In this case, the area of contact between the wire W and the electrode layer EL becomes small, with consequent fear of deterioration in the coupling strength between the wire W and the electrode layer EL. That is, in the ordinary semiconductor device it is considered general to make the ball diameter of the wire W smaller than the size of the electrode layer EL lest the wire W should be coupled to a stepped portion formed in the electrode layer EL. In the ordinary semiconductor device, therefore, if the width of the electrode layer EL and that of the opening OP are reduced, there arises the necessity of making the ball diameter of the wire W small. As a result, there arises a fear of deterioration in the coupling strength between the wire W and the electrode layer EL.

However, in the semiconductor device SA of this embodiment, even if the wire W strikes on a stepped portion of the electrode layer EL, a crack CLK cannot easily develop in the passivation film PAS because there exists the condition L1<L2. That is, in this first embodiment, even in case of adopting the embodying means 1 of making the width of the opening OP small, it is not always necessary to make the ball diameter of the wire W small in proportion to making the width of the opening OP small. Therefore, even in case of using the embodying approach 1, it is possible to maintain the adhesive strength between the wire W and the electrode layer EL because it is possible to ensure a required area of contact between the wire W and the electrode layer EL.

<Embodying Approach 2 (Large Pad PAD)>

Figure 9:
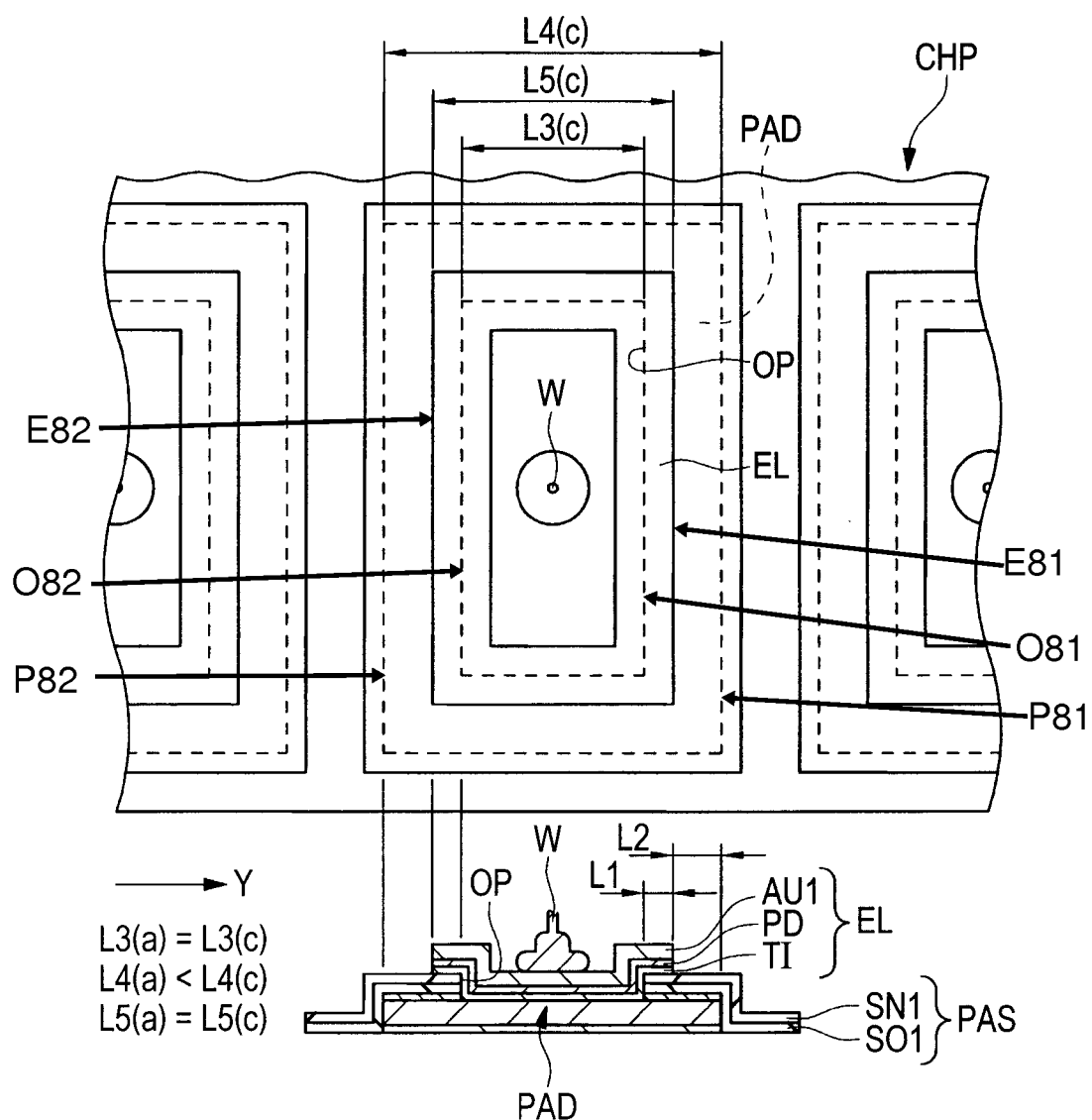
FIG. 9 is an enlarged diagram of a partial area in FIG. 2, embodying the technical idea of the first embodiment.

Next, a description will be given about embodying approach 2 which embodies a feature of this first embodiment. FIG. 9 is an enlarged diagram of an area YR in FIG. 2 in the semiconductor chip CHP used in the first embodiment. In FIG. 9, three pads PAD arranged in Y direction are shown on an upper side, while on a lower side there is shown a sectional view corresponding to a plan view of a pad PAD.

As shown in the upper, plan view in FIG. 9, given that the width in Y direction of the pad PAD is $L4(c)$, the width in Y direction of the electrode layer EL is $L5(c)$ and the width in Y direction of the opening OP is $L3(c)$, there exists a relation of $L4(c) > L5(c) > L3(c)$. That is, the electrode layer EL is formed so as to be planarly included in the pad PAD and the opening OP is formed so as to be planarly included in the electrode layer EL. In the semiconductor chip CHP thus configured according to this first embodiment, as shown in FIG. 9, given that a planar distance between a first end E81 of the electrode layer EL and a first end E82 of the opening OP is L1 and a planar distance between the first end E81 of the electrode layer EL and a first end O81 of the opening OP is L2, there exists a relation of L1<L2. That is, the planar distance (L2) between one end of the electrode layer EL and one end of the pad PAD is larger than the planar distance (L1) between one end of the electrode layer EL and one end of the opening OP. Thus, the feature (L1<L2) in this first embodiment is realized.

In this embodying approach 2 of FIG. 9, L2 may be greater than L1 by anywhere from 50% to 100%, though it may exceed L1 by other amounts as well.

More specifically, if a comparison is made between FIG. 5 showing the prior art and FIG. 9 which is concerned with this first embodiment, it is seen that the width L3(a) in Y direction of the opening OP in the prior art and the width L3(b) in Y direction of the opening OP in this first embodiment are equal (L3(a)=L3(b)) and that the width L5(a) in Y direction of the electrode layer EL in the prior art and the width L5(c) in Y direction of the electrode layer EL in this first embodiment are also equal (L5(a)=L5(c)). A difference in technical idea between the prior art and this first embodiment resides in that the width L4(c) in Y direction of the pad PAD in this first embodiment is larger than the width L4(a) in Y direction of the pad PAD in the prior art.

Thus, in the prior art there is established the relation L1>L2, while in this first embodiment its feature L1<L2 is embodied. That is, according to the embodying approach 2 which embodies the feature in this first embodiment, the condition L1<L2 is realized by making the width of the pad PAD larger than in the prior art. In other words, the embodying approach 2 satisfies the condition L1<L2 by making adjustment so that the width L4(c) in Y direction of the pad PAD is increased while fixing the width L3(c) in Y direction of the opening OP and the width L5(c) in Y direction of the electrode layer EL Also according to the embodying approach 2 and as seen in FIG. 9, in the Y direction, the pad PAD has opposing parallel first and second end portions P81, P82; the electrode layer EL has opposing parallel first and second end portions E81, E82 and the opening OP has opposing parallel first and second end portions O81, O82. Thus, in Y direction parallel to one side of the pad PAD, the second spacing between a second end portion E82 of the electrode layer EL and a second end portion P82 of the pad PAD is larger than the first spacing between the second end portion E82 of the electrode layer EL and a second end portion O82 of the opening OP formed in the passivation film PAS. Also in X direction orthogonal to Y direction, the second spacing between an end portion of the electrode layer EL and an end portion of the pad PAD is larger than the first spacing between an end portion of the electrode layer EL and an end portion of the opening OP formed in the passivation film PAS. Thus, also in the embodying approach 2, the relation of L1<L2 is established in both Y and X directions.

Thus, in this first embodiment, even when the position of the wire W coupled to the electrode layer EL is deviated in Y direction, it is possible to prevent the occurrence of a crack CLK in the passivation film PAS because the characteristic condition (L1<L2) in this first embodiment exists in Y direction. Further, even when the position of the wire W coupled to the electrode layer EL is deviated in X direction, it is possible to prevent the occurrence of a crack CLK in the passivation film PAS because the characteristic condition (L1<L2) in this first embodiment exists in X direction.

That is, a deviating direction of the wire W coupled to the electrode layer EL is arbitrary, but according to this first embodiment there exists the characteristic condition (L1<L2) in both Y and X directions orthogonal to each other, so even when the coupled position of the wire W deviates in an arbitrary direction, it is possible to suppress the occurrence of a crack CLK in the passivation film PAS and hence possible to improve the reliability of the semiconductor device SA in this first embodiment.

Thus, the embodying approach 2 in this first embodiment achieves the condition L1<L2 by making adjustment so that the width of the pad PAD is increased while fixing the width of the opening OP and that of the electrode layer EL. An advantage of the embodying approach 2 resides in that the occurrence of a crack CLK in the passivation film PAS can be suppressed by establishing the characteristic condition (L1<L2) without making the width of the opening OP small. That is, according to the embodying approach 2, since the width of the opening OP is not made small, it is possible to ensure a required area of contact between the electrode layer EL and the wire W and hence possible to improve the coupling strength between the electrode layer EL and the wire W. On the other hand, the embodying approach 2 is a technique running counter to the narrowing in pitch of pads PAD because the width of each pad PAD is increased. Therefore, it is preferable that the embodying approach 2 which embodies the feature of the present invention be applied to products for which the narrowing in pitch of pads PAD is not so strictly required.

<Embodying Approach 3 (Small Electrode Layer EL)>

Figure 10:
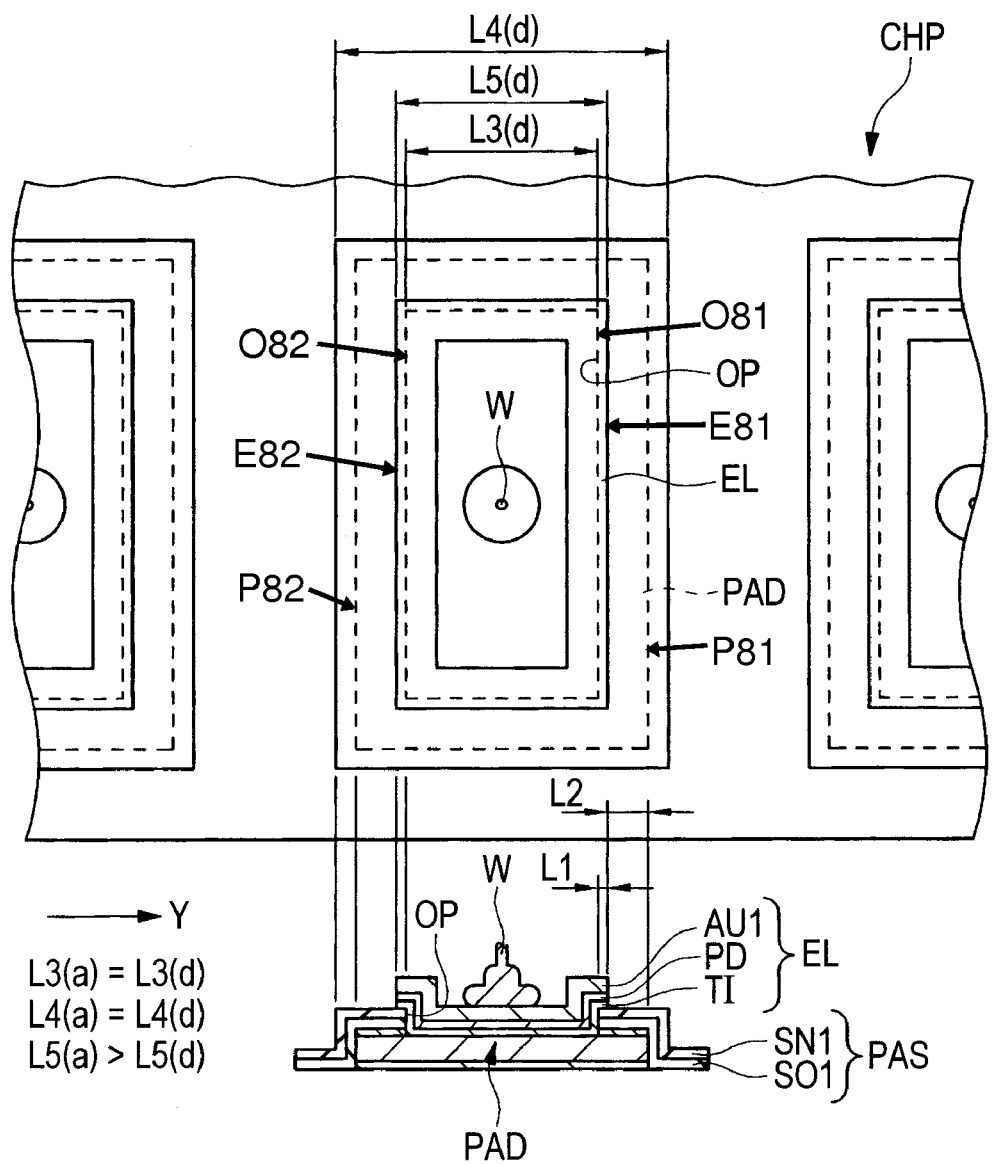
FIG. 10 is an enlarged diagram of a partial area in FIG. 2, embodying the technical idea of the first embodiment.

Next, a description will be given about embodying approach 3 which embodies a feature in this first embodiment. FIG. 10 is an enlarged diagram of the area YR in FIG. 2 in connection with the semiconductor chip CHP used in the first embodiment. In FIG. 10, three pads arranged in Y direction are shown on an upper side, while on a lower side is shown a sectional view corresponding to a plan view of a pad PAD.

As shown in the upper, plan view in FIG. 10, given that the width in Y direction of the pad PAD is L4(d), the width in Y direction of the electrode layer EL is L5(d) and the width in Y direction of the opening OP is L3(d), there exists a relation of L4(d)>L5(d)>L3(d). That is, the electrode layer EL is formed so as to be planarly included in the pad PAD and the opening OP is formed so as to be planarly included in the electrode layer EL. In the thus-configured semiconductor chip CHP used in this first embodiment, as shown in FIG. 10, given that a planar distance between a first end E81 of the electrode layer EL and a first end O81 of the opening OP is L1 and a planar distance between the first end E81 of the electrode layer EL and a first end P81 of the pad PAD is L2, there exists a relation of L1<L2. That is, the second planar distance (L2) between the first end E81 of the electrode layer EL and the first end P81 of the pad PAD is longer than the first planar distance (L1) between the first end E81 of the electrode layer EL and the first end O81 of the opening OP and thus the feature (L1<L2) in this first embodiment is realized.

In this embodying approach 3 of FIG. 10, L2 may be greater than L1 by anywhere from 100% to 500%, though it may exceed L1 by other amounts as well. Thus using the different approaches, L2 may exceed L1 by a wide range.

More specifically, a comparison between FIG. 5 illustrating the prior art and FIG. 10 related to this first embodiment shows that the width L3(a) in Y direction of the opening OP in the prior art and the width L3(d) in Y direction of the opening OP in this first embodiment are equal (L3(a)=L3(d)) and that the width L4(a) in Y direction of the pad PAD in the prior art and the width L4(d) in Y direction of the pad PAD in this first embodiment are also equal (L4(a)=L4(d)). A difference in technical idea between the prior art and this first embodiment resides in that the width L5(d) in Y direction of the electrode layer EL in this first embodiment is smaller than the width L5(a) in Y direction of the electrode layer EL in the prior art.

Thus, in the prior art there exists the condition L1>L2, while in this first embodiment its feature L1<L2 is embodied.

That is, according to the embodying approach 3 which embodies the feature in this first embodiment, the condition L1<L2 is satisfied by making the width of the electrode layer EL smaller than in the prior art. In other words, the embodying approach 3 satisfies the condition L1<L2 by making adjustment so that the width L5(d) in Y direction of the electrode layer EL is reduced while fixing the width L3(d) in Y direction of the opening OP and the width L4(d) in Y direction of the pad PAD.

Also in the embodying approach 3 and as seen in FIG. 9, in the Y direction, the pad PAD has opposing parallel first and second end portions P81, P82; the electrode layer EL has opposing parallel first and second end portions E81, E82 and the opening OP has opposing parallel first and second end portions O81, O82. Thus, in Y direction parallel to one side of the pad PAD, the second spacing between a second end portion E82 of the electrode layer EL and a second end portion P82 of the pad PAD is larger than the first spacing between the second end portion E82 of the electrode layer EL and a second end portion O82 of the opening OP formed in the passivation film PAS. Further, also in X direction orthogonal to Y direction, the spacing between a first end portion of the electrode layer EL and a first end portion of the pad PAD is larger than the spacing between the first end portion of the electrode layer EL and a first end portion of the opening OP formed in the passivation film PAS. Thus, also according to the embodying approach 3 the relation of L1<L2 exists in both Y and X direction.

Thus, in this first embodiment, even when the position of wire W coupled to the electrode layer EL is deviated in Y direction, it is possible to prevent the occurrence of a crack CLK in the passivation film PAS because the characteristic condition (L1<L2) in this first embodiment exists in Y direction. Further, even when the position of wire W coupled to the electrode layer EL is deviated in X direction, it is possible to prevent the occurrence of a crack CLK in the passivation film PAS because the characteristic condition (L1<L2) in this first embodiment exists in X direction.

That is, a deviating direction of the wire W coupled to the electrode layer EL is arbitrary, but according to this first embodiment, even when the coupled position of the wire W deviates in an arbitrary direction, the occurrence of a crack CLK in the passivation film PAS can be suppressed because the characteristic condition (L1<L2) exists in both Y and X directions orthogonal to each other, and hence it is possible to improve the reliability of the semiconductor device SA according to this first embodiment.

Thus, the embodying approach 3 in this first embodiment satisfies the condition L1<L2 by making adjustment so as to reduce the width of the electrode layer EL while fixing the width of the opening OP and that of the pad PAD as in the prior art. An advantage of this embodying approach 3 resides in that the condition L1<L2 is satisfied while keeping the width of the opening OP large and without enlarging the width of the pad PAD. That is, according to the embodying approach 3, since the width of the opening OP is not reduced, it is not necessary to make the ball diameter of the wire W small and it is possible to ensure a required area of contact between the electrode layer EL and the wire W. As a result, it is possible to improve the coupling strength between the electrode layer EL and the wire W. According to the embodying approach 3, moreover, since the width of the pad PAD is not increased, it permits the narrowing of the pad PAD pitch and thus permits application also to products with a narrow pad pitch to a satisfactory extent. That is, according to the embodying approach 3, while ensuring the coupling strength between the electrode layer EL and the wire W and coping with the narrowing of the pad PAD pitch, the characteristic condition L1<L2 in the present invention is established, thus making it possible to suppress the occurrence of a crack CLK in the passivation film PAS.

<Effect Obtained in the First Embodiment>

As described above, the feature of the technical idea in this first embodiment is that the planar distance (L2) between one end of the electrode layer EL and one end of the pad PAD is made larger than the planar distance (L1) between one end of the electrode layer EL and one end of the opening OP. This feature can be realized by any one of embodying approaches 1 to 3. According to the technical idea in this first embodiment there is obtained an outstanding effect such that even when the position where the wire W is coupled to the electrode layer EL is deviated, the stress imposed on the passivation film PAS can be relaxed and hence it is possible to suppress the occurrence of a crack CLK in the passivation film PAS. This point will be described below in comparison with the prior art.

Figure 11:
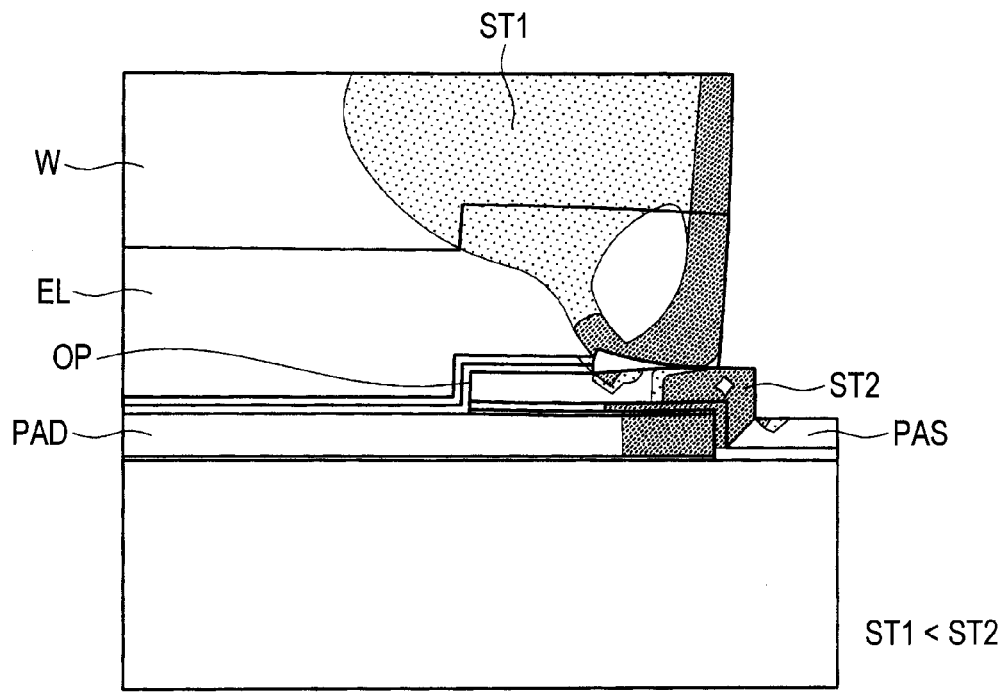
FIG. 11 is a diagram showing a simulation result of a stress distribution near a pad in the conventional technique.

FIG. 11 is a diagram showing the result of having simulated a stress distribution near a pad PAD in the prior art. In FIG. 11, a passivation film PAS is formed so as to cover the pad PAD and a part of the passivation film PAS is removed to form an opening OP to which a part of the pad PAD is exposed. An electrode layer EL is formed so as to overhang the passivation film PAS from the interior of the opening OP and a wire W is coupled to the electrode layer EL. In FIG. 11, given that a first planar distance between one end of the electrode layer EL and one end of the opening OP is L1 and a second planar distance between one end of the electrode layer EL and one end of the pad PAD is L2, there exists a relation of L1>L2. That is, the planar distance (L2) between one end of the electrode layer EL and one end of the pad PAD is smaller than the planar distance (L1) between one end of the electrode layer EL and one end of the opening OP.

If in this state a stress distribution which is created near the pad PAD by a load applied at the time of coupling the wire W is simulated, there is obtained such a result as shown in FIG. 11. In the same figure, there are shown stress values ST1 and ST2, the latter being larger than the former as indicated by the shading density. From the result of FIG. 11, it is seen that in the prior art a large stress (stress value ST2) is applied near a stepped portion of the passivation film PAS which covers an end portion of the pad PAD. Thus, it is seen that in the prior art, a crack CLK is apt to occur near the stepped portion of the passivation film PAS which covers an end portion of the pad PAD.

Figure 12:
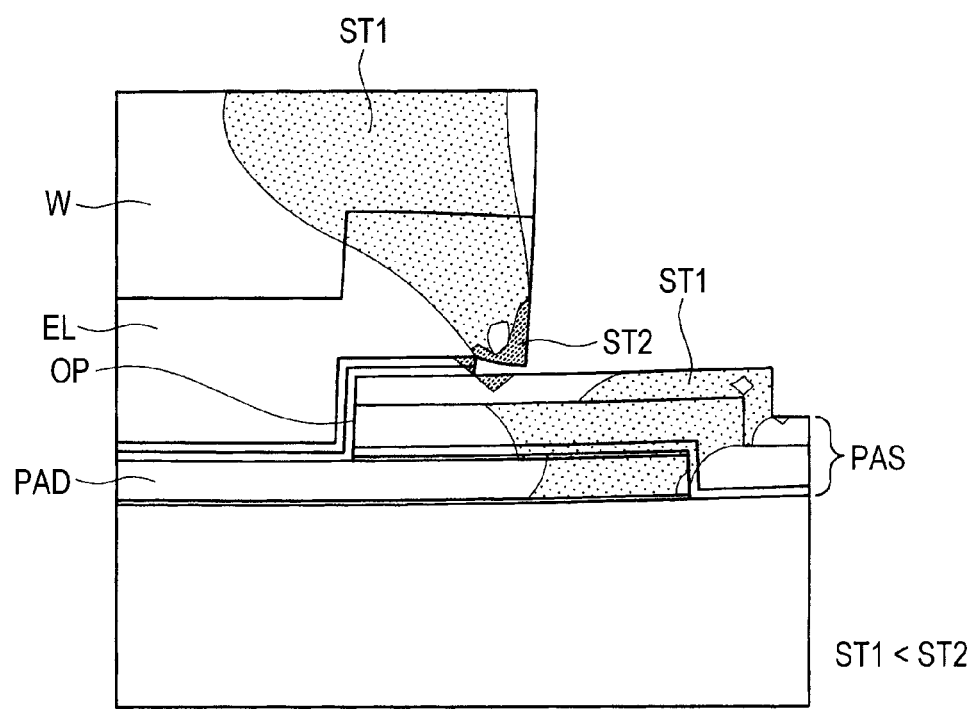
FIG. 12 is a diagram showing a simulation result of a stress distribution near a pad in the first embodiment.

On the other hand, FIG. 12 is a diagram showing the result of having simulated a stress distribution near a pad PAD in this first embodiment of the present invention. In FIG. 12, a passivation film PAS is formed so as to cover the pad PAD and a part of the passivation film PAS is removed to form an opening OP to which a part of the pad PAD is exposed. An electrode layer EL is formed so as to overhang the passivation film PAS from the interior of the opening OP and a wire W is coupled to the electrode layer EL. In FIG. 12, a second planar distance (L2) between one end of the electrode layer EL and one end of the pad PAD is larger than a first planar distance (L1) between one end of the electrode layer EL and one end of the opening OP. That is, in FIG. 12 there exists the characteristic condition (L1<L2) of this first embodiment.

If a stress distribution which is created near the pad PAD by a load applied at the time of coupling the wire W is simulated in this state, there is obtained such a result as shown in FIG. 12. In the same figure there are shown stress values ST1 and ST2. More specifically, a look at FIG. 12 shows that a smaller stress (stress value ST1) than in the prior art is applied to near a stepped portion of the passivation film PAS which covers an end portion of the pad PAD. Thus, it is seen that in the first embodiment it is possible to diminish the stress applied to near a stepped portion of the passivation film PAS which covers an end portion of the pad PAD. This means that according to the first embodiment it is possible to suppress the occurrence of a crack CLK at a stepped portion of the passivation film PAS which covers the pad PAD. Thus, the first embodiment proves the attainment of an outstanding effect such that the occurrence of a crack CLK at a stepped portion of the passivation film PAS can be suppressed by improving the structure near the pad PAD so that the characteristic condition (L1<L2) is established. In this first embodiment, since the occurrence of a crack CLK can thus be suppressed, it is possible to prevent corrosion of the pad PAD which is caused by the entry of water from the crack CLK and hence possible to improve the reliability of the semiconductor device SA.

<Semiconductor Wafer Manufacturing Method>

Figure 13:
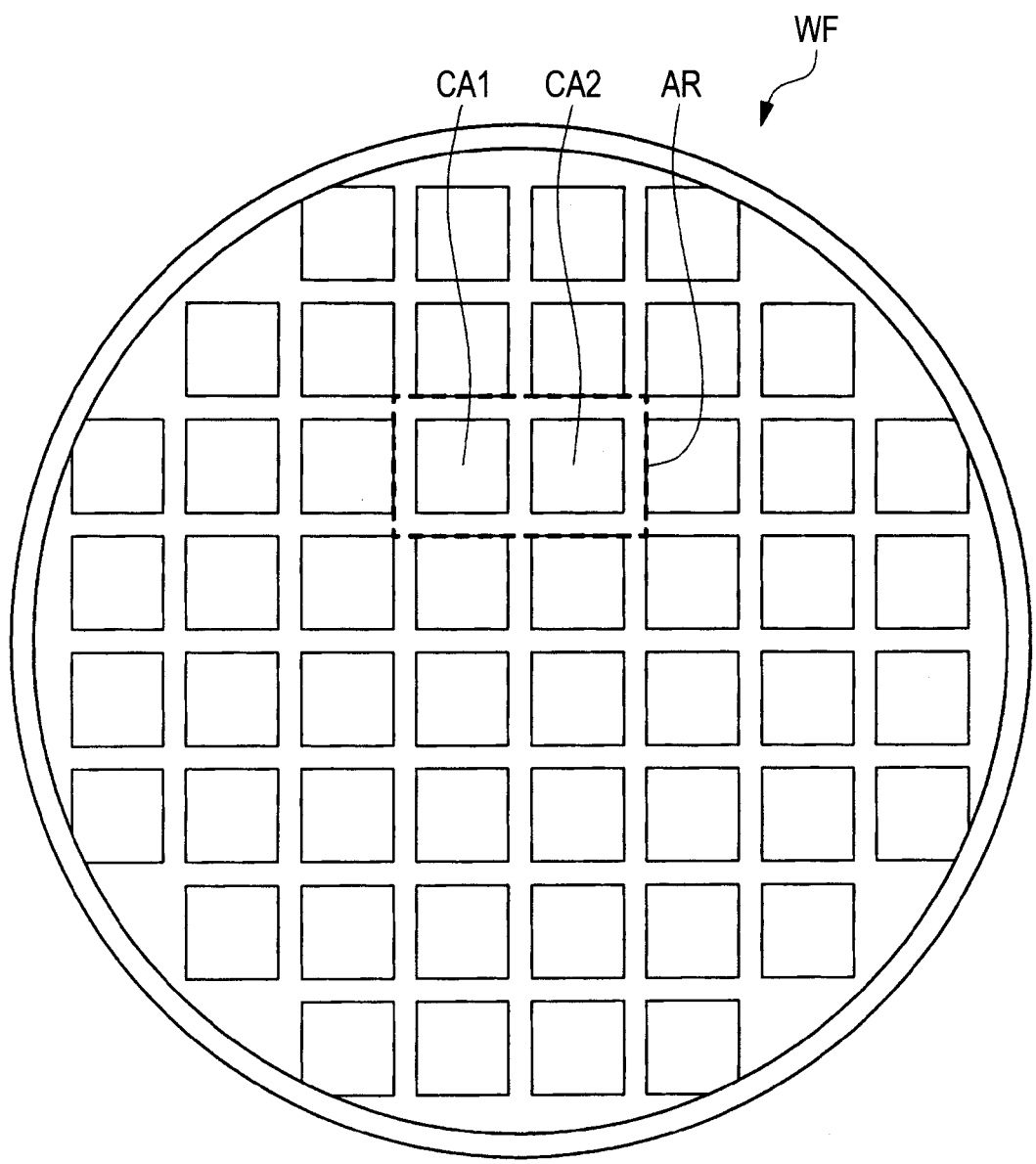
FIG. 13 is a diagram showing a semiconductor wafer used in the first embodiment.

The semiconductor device SA according to this first embodiment is configured as above. A method of manufacturing the semiconductor device will be described with reference to drawings. First, a disc-like semiconductor wafer WF is provided as shown in FIG. 13. A main surface (surface) of the semiconductor wafer WF is partitioned into plural chip areas. For example, in an area AR shown in FIG. 13 there are disposed chip areas CA1 and CA2 adjacently to each other. In each chip area of such a semiconductor wafer WF there are formed semiconductor elements such as MISFETs, thereafter, in such a manner as to cover the MISFETs there are formed an interlayer dielectric film and a wiring layer. That is, by forming the MISFETs and the wiring layer on the semiconductor wafer WF there is formed an integrated circuit on the wafer WF. The wiring layer has, for example, a multi-layer interconnection structure comprising plural wiring layers. A description will be given below about steps subsequent to a step of forming wiring lines in the top layer of the multi-layer interconnection while making reference to the chip areas CA1, CA2 adjacent to each other and a scribing area SBR positioned between the chip areas CA1 and CA2.

Figure 14:
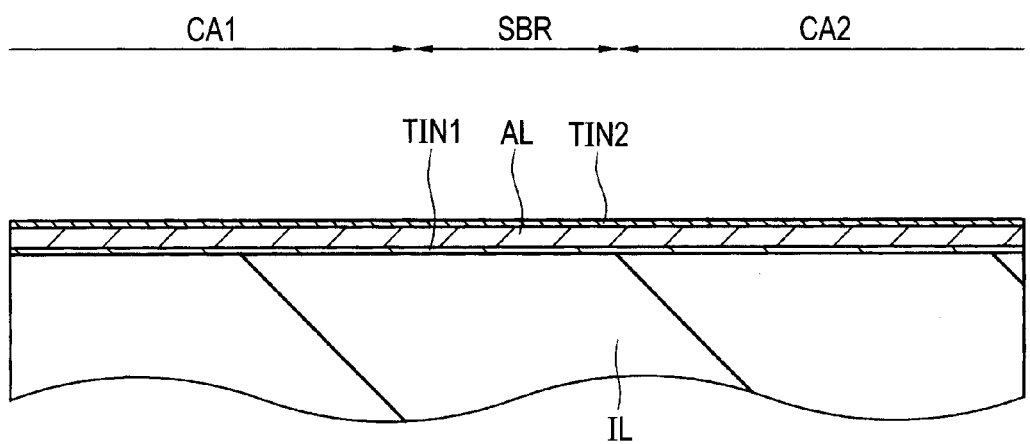
FIG. 14 is a sectional view showing a semiconductor wafer manufacturing step in the first embodiment.

For example, as shown in FIG. 14, titanium nitride film TIN1 is formed on an interlayer dielectric film IL which is silicon oxide film, then aluminum film AL is formed on the titanium nitride film TIN1. Further, titanium nitride film TIN2 is formed on the aluminum film AL. The titanium nitride film TIN1, aluminum film AL and titanium nitride film TIN2 are formed, for example, by using a sputtering method.

Figure 15:
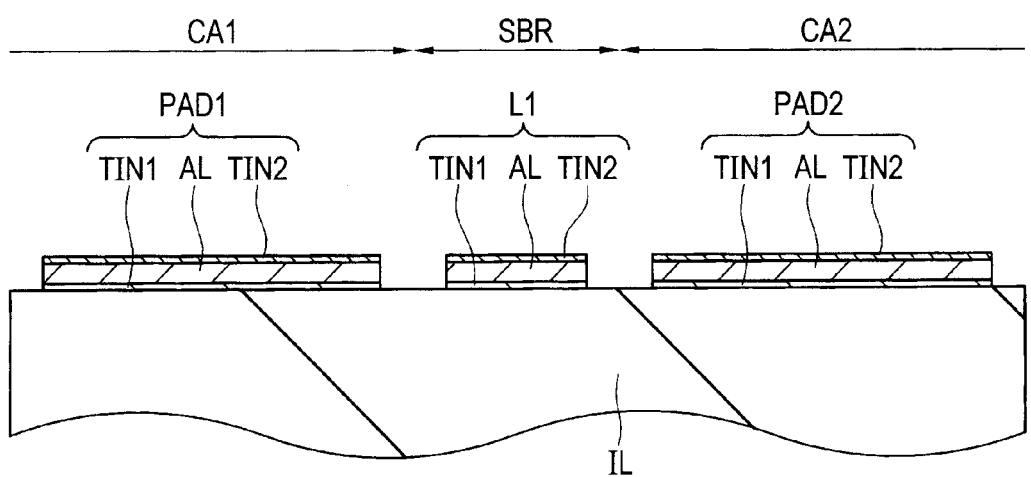
FIG. 15 is a sectional view showing a semiconductor wafer manufacturing step which follows FIG. 14.

Subsequently, as shown in FIG. 15, the titanium nitride film TIN1, aluminum film AL and titanium nitride film TIN2 are subjected to patterning by photolithography technique and etching technique. As a result, in the chip area CA1 is formed a pad PAD1 comprised of titanium nitride film TIN1, aluminum film AL and titanium nitride film TIN2. Likewise, in the chip area CA2 is formed a pad PAD2 comprised of titanium nitride film TIN1, aluminum film AL and titanium nitride film TIN2. Further, in the scribing area SBR is formed an evaluation wiring line L1 comprised of titanium nitride film TIN1, aluminum film AL and titanium nitride film TIN2. In case of implementing the embodying approach 2, the width of the pad PAD formed on the chip area CA1 is adjusted so as to become larger than in the prior art and the width of the pad PAD2 formed in the chip area CA2 is also adjusted so as to become larger than in the prior art.

Figure 16:
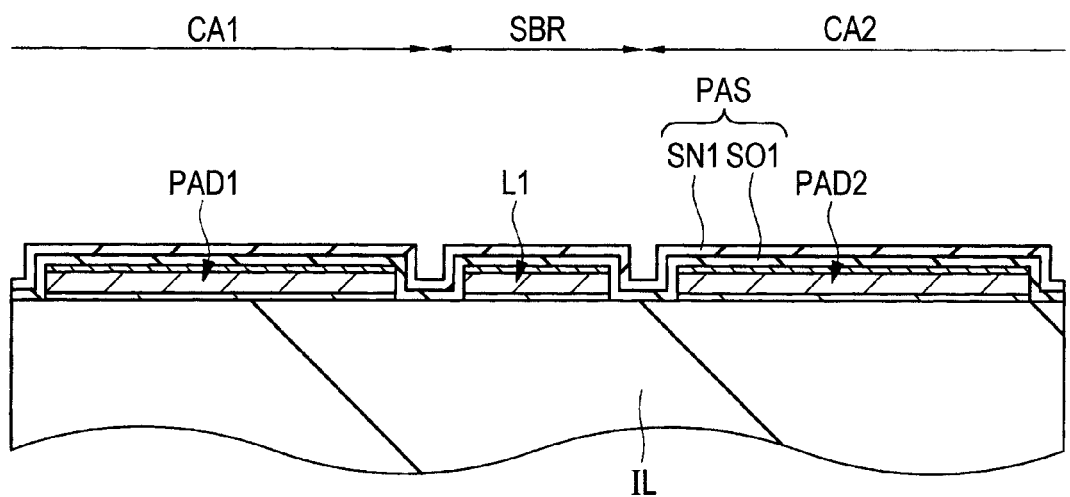
FIG. 16 is a sectional view showing a semiconductor wafer manufacturing step which follows FIG. 15.

Next, as shown in FIG. 16, a passivation film PAS is formed on the interlayer dielectric film IL with pads PAD1, PAD2 and evaluation wiring line L1 formed thereon. The passivation film PAS can be formed, for example, by a CVD method. More specifically, the passivation film PAS is formed by silicon oxide film SO1 and silicon nitride film SN1 formed on the silicon oxide film SO1.

Figure 17:
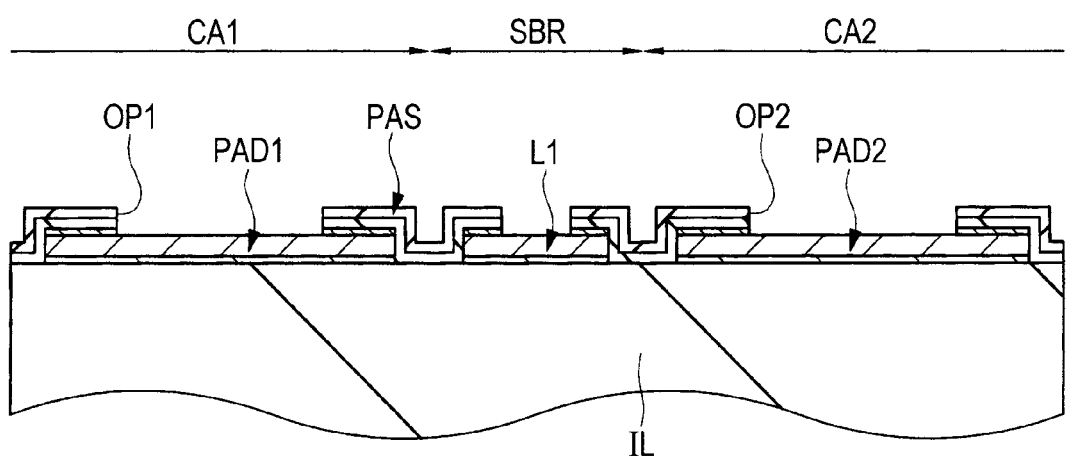
FIG. 17 is a sectional view showing a semiconductor wafer manufacturing step which follows FIG. 16.

Then, as shown in FIG. 17, openings are formed in the passivation film PAS by photolithography technique and etching technique. More specifically, in the chip area CA1 is formed an opening OP1 to which a part of the surface of the pad PAD1 is exposed, while in the chip area CA2 is formed an opening OP2 to which a part of the surface of the pad PAD2 is exposed. At this time, the titanium nitride film TIN2 is removed from the surface of the pad PAD1 which is exposed to the bottom of the opening OP1, causing the aluminum film AL to be exposed. Likewise, also from the surface of the pad PAD2 exposed to the bottom of the opening OP2 there is removed the titanium nitride film TIN2, causing the aluminum film AL to be exposed.

Also in the scribing area SBR is formed an opening to which a part of the surface of the evaluation wiring line L1 is exposed. In case of implementing the embodying approach 1, the diameter (width) of the opening OP1 formed in the chip area CA1 is adjusted so as to become smaller than in the prior art and the diameter (width) of the opening OP2 formed in the chip area CA2 is also adjusted so as to become smaller than in the prior art.

Figure 18:
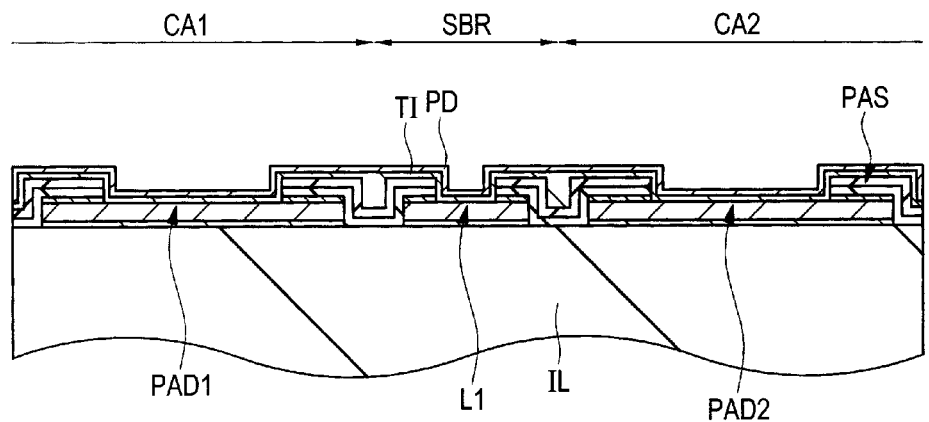
FIG. 18 is a sectional view showing a semiconductor wafer manufacturing step which follows FIG. 17.

Then, as shown in FIG. 18, titanium film TI is formed on the passivation film PAS which includes the interior of the opening OP1 and the interior of the opening OP2, and palladium film PD is formed on the titanium film TI. The titanium film TI and the palladium film PD can be formed, for example, by a sputtering method.

Figure 19:
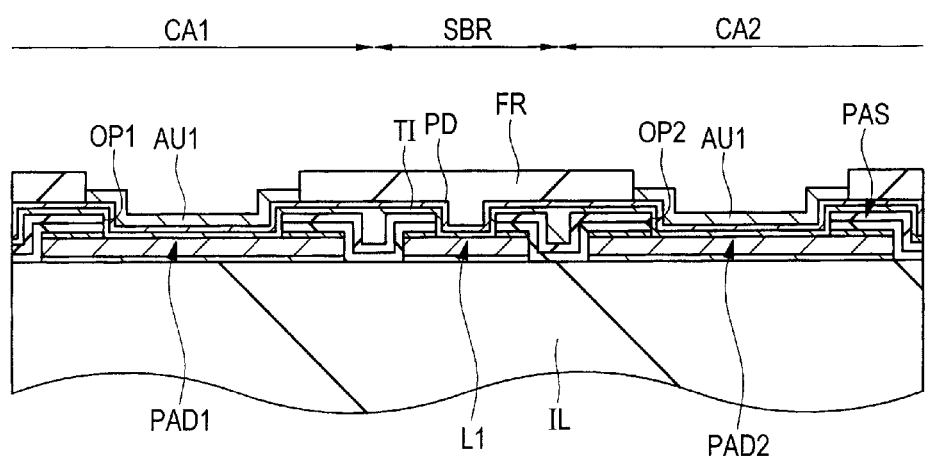
FIG. 19 is a sectional view showing a semiconductor wafer manufacturing step which follows FIG. 18.

Thereafter, as shown in FIG. 19, resist film FR is applied onto the palladium film PD and is subjected to exposure and development for patterning. The patterning of the resist film FR is performed so as not to remain in the area where an electrode layer is formed. In case of implementing the embodying approach 3, in the chip area CA1 the width of an opening formed in the resist film FR is adjusted so as to become smaller than in the prior art and likewise in the chip area CA2 the width of an opening formed in the resist film FR is adjusted so as to become smaller than in the prior art. Further, by an electrolytic plating method using the titanium film TI and the palladium film PD as electrodes, gold film AU1 is formed on the palladium film PD which is exposed from the opening formed in the resist film FR.

Figure 20:
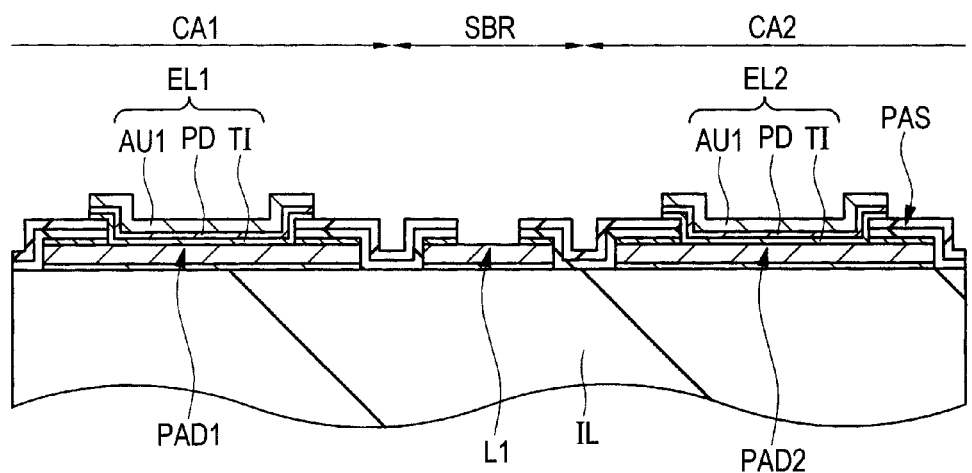
FIG. 20 is a sectional view showing a semiconductor wafer manufacturing step which follows FIG. 19.

Next, as shown in FIG. 20, the patterned resist film FR is removed and the palladium film PD and the titanium film TI both exposed as a result of removal of the resist film FR are removed. In this way it is possible to form electrode layers EL1 and EL2 on the semiconductor wafer WF. More specifically, in the chip area CA1 is formed an electrode layer EL1 comprised of titanium film TI, palladium film PD and gold film AU1, while in the chip area CA2 is formed an electrode layer EL2 comprised of titanium film TI, palladium film PD and gold film AU1. In the chip area CA1 a second planar distance (L2) between one end of the electrode layer EL1 and one end of the pad PAD1 is larger than a first planar distance (L1) between one end of the electrode layer EL1 and one end of the opening OP1 and thus a characteristic structure in this first embodiment is implemented. Also in the chip area CA2 a second planar distance (L2) between one end of the electrode layer EL2 and one end of the pad PAD2 is larger than a first planar distance (L1) between one end of the electrode layer L2 and one end of the opening OP2 and thus a characteristic structure in this first embodiment is implemented. In this way it is possible to fabricate the semiconductor wafer WF in this first embodiment.

Figure 21:
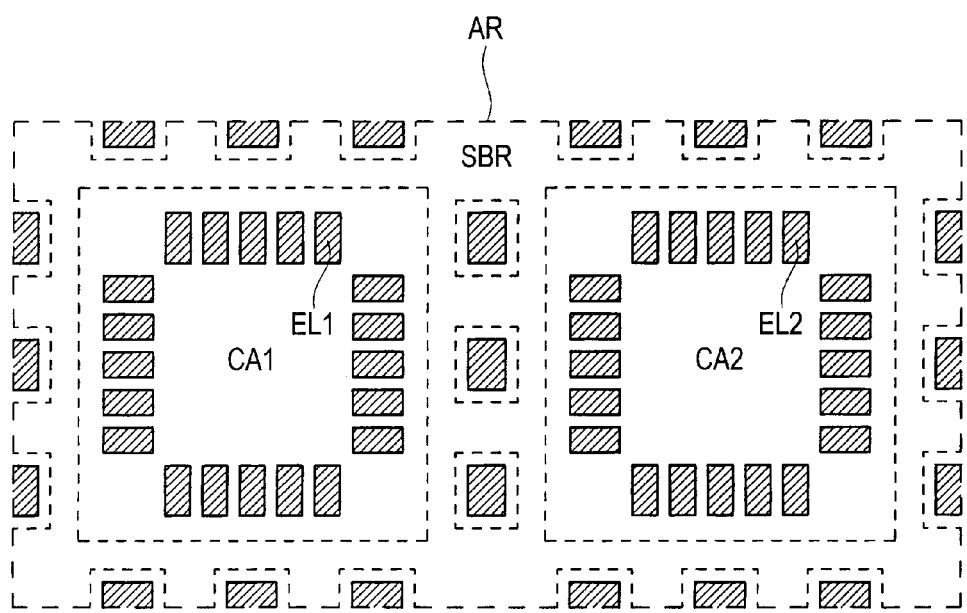
FIG. 21 is an enlarged diagram of a partial area of the semiconductor wafer in the first embodiment.

FIG. 21 is a diagram showing on a larger scale an area AR which is a part of the semiconductor wafer WF in this first embodiment. In the area AR, as shown in FIG. 21, chip areas CA1 and CA2 are disposed through a scribing area SBR. It is seen that in the chip area CA1 which is quadrangular in shape there are formed electrode layers EL1 along each of four sides and that in the chip area CA2 which is also quadrangular in shape there are formed electrode layers EL2 along each of four sides.

<Semiconductor Device Manufacturing Method>

Next, a semiconductor device manufacturing method in this first embodiment will be described with reference to drawings. In this process there is utilized the semiconductor wafer WF fabricated in the process described above. It is optional whether the following process is to be performed after execution of the above semiconductor wafer WF manufacturing process or by buying and using a semiconductor wafer WF which has been fabricated in accordance with the process described above.

Figure 22:
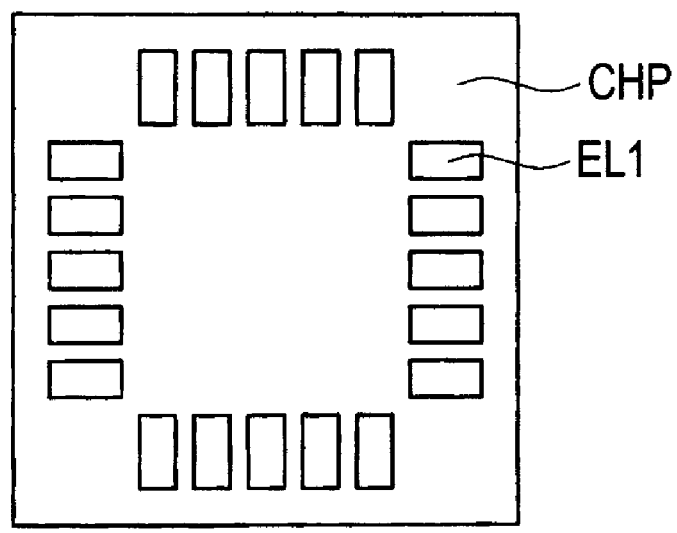
FIG. 22 is a plan view showing a semiconductor chip used in the first embodiment.

A semiconductor chip is obtained by dicing the semiconductor wafer WF fabricated in the above process. For example, the semiconductor wafer WF is cut by moving a dicing blade along the scribing areas SBR of the semiconductor wafer WF described above to obtain a plurality of semiconductor chips. FIG. 22 is a plan view of a semiconductor chip CHP. The semiconductor chip CHP s obtained, for example, by cutting out the chip area CA1 of the semiconductor wafer WF. As shown in FIG. 22, the semiconductor chip CHP is quadrangular in shape and plural electrodes EL1 are formed along each of four sides.

Figure 23:
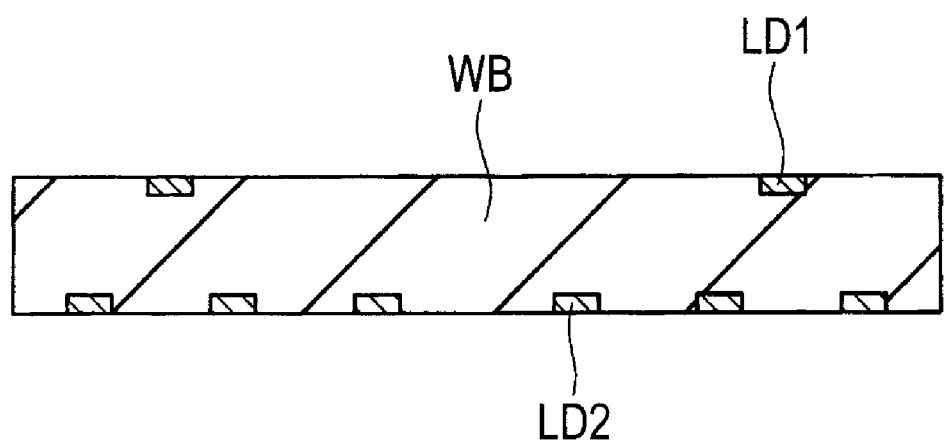
FIG. 23 is a sectional view showing a wiring board used in the first embodiment.

On the other hand, as shown in FIG. 23, a wiring board WB is provided. Upper leads LD1 are formed on a main surface (surface) of the wiring board WB, while lower leads LD2 are formed on a back surface of the wiring board WB. Though not shown in FIG. 23, multi-layer interconnections and via holes (plugs) for coupling between the inter-layer interconnections are formed in the interior of the wiring board WB. The upper leads LD1 formed on the main surface of the wiring board WB and the lower leads LD2 formed on the back surface of the wiring board WB are connected together electrically through the multi-layer interconnections and via holes formed in the interior of the wiring board WB. The wiring board WB is provided as a multi-package board.

Figure 24:
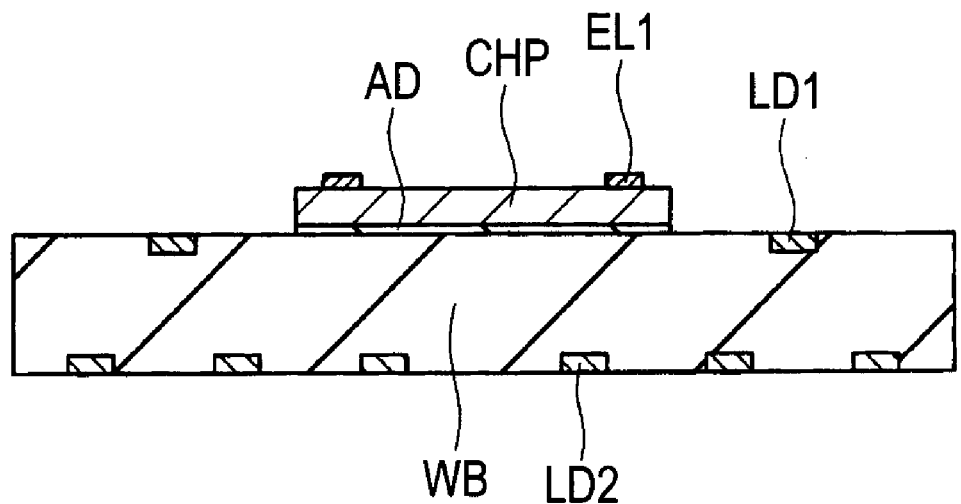
FIG. 24 is a sectional view showing a semiconductor device manufacturing step in the first embodiment.

Next, as shown in FIG. 24, the semiconductor chip CHP is mounted onto the main surface of the wiring board WB. At this time, the wiring board WB and the semiconductor chip CHP are bonded together through an insulating adhesive AD. The semiconductor chip CHP is mounted on the wiring board WB in such a manner that its main surface side with the electrode layers EL1 formed thereon faces up. That is, the semiconductor chip CHP is mounted in a state in which its back surface opposite to the main surface faces toward the wiring board WB.

Figure 25:
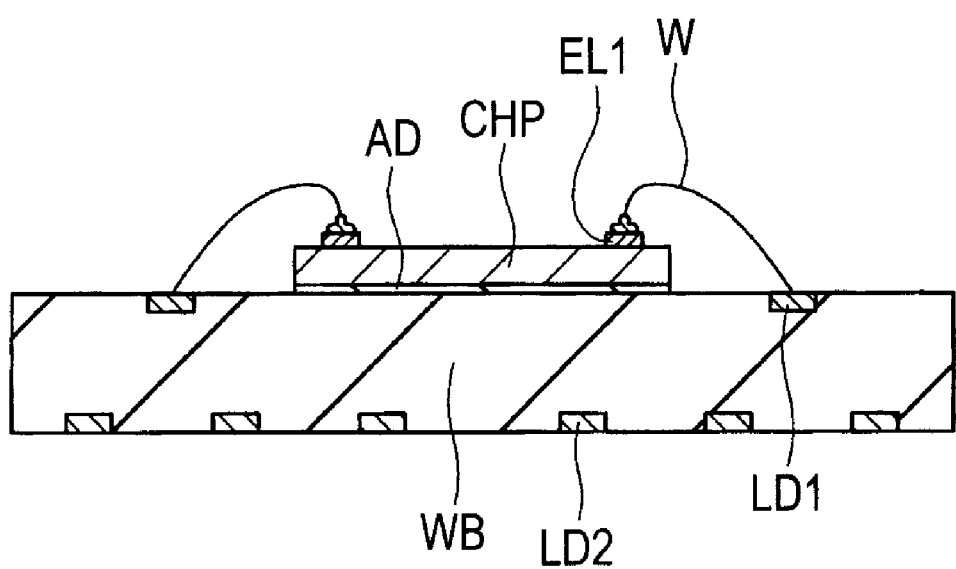
FIG. 25 is a sectional view showing a semiconductor device manufacturing step which follows FIG. 24.

Subsequently, as shown in FIG. 25, each electrode layer EL1 formed on the semiconductor chip CHP and the associated upper lead LD1 formed on the wiring board WB are coupled together through a wire W. In this wire bonding step, using a capillary, a gold wire (ball) is first-bonded to the electrode layer EL1 formed on the semiconductor chip CHP and thereafter a gold wire is second-bonded to the upper lead LD1 formed on the wiring board WB, thereby coupling the electrode layer EL1 and the upper lead LD1 with each other through the wire W.

Figure 26:
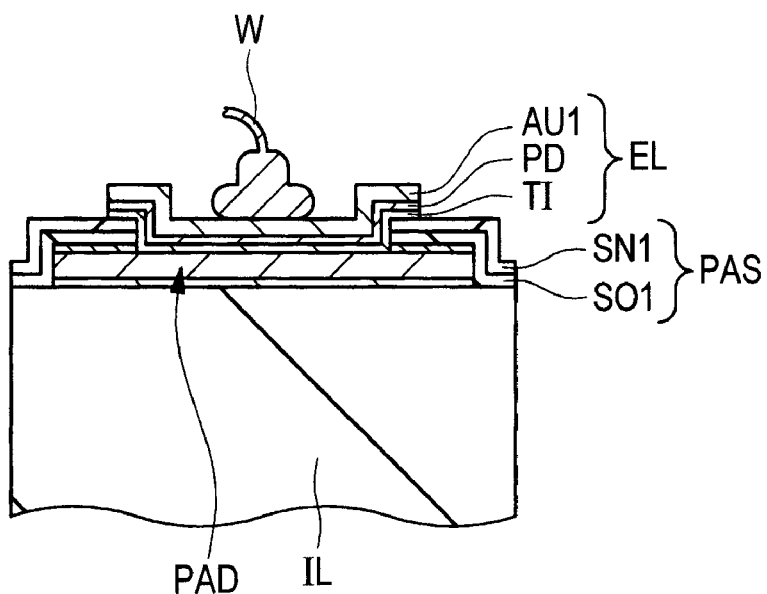
FIG. 26 is a sectional view showing an example of coupling a wire to an electrode layer normally.
Figure 27:
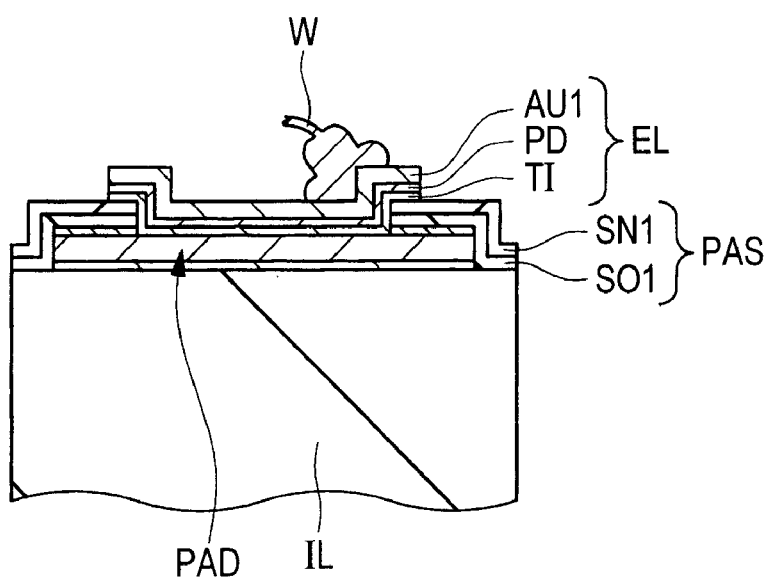
FIG. 27 is a sectional view showing an example of coupling a wire to the electrode layer in a deviated state.

FIG. 26 is a sectional view showing a coupled state of wire W to the electrode layer EL1. Usually, the wire W (ball) is coupled to a central part of the electrode layer EL1 as shown in FIG. 26. However, there sometimes is a case where the position of the wire W coupled to the electrode layer EL1 deviates from the central part, depending on the accuracy of the capillary (bonding tool) used. FIG. 27 is a sectional view showing a case where the position of the wire W coupled to the electrode layer EL1 is deviated to an end side of the electrode layer EL1. In this case, as shown in FIG. 27, the wire W (ball) is formed so as to strike on a stepped portion formed near the end portion of the electrode layer EL1.

In the wire bonding process, since the wire W is coupled using both load and ultrasonic wave, the load applied is imposed on the stepped portion of the electrode layer EL1. Then, the load thus imposed on the stepped portion of the electrode layer EL1 is transmitted as stress to the underlying pad PAD, resulting in deformation of the pad PAD. Further, with a strong stress applied to an end portion of the pad PAD, a strong stress is imposed on the passivation film PAS which covers the pad end. That is, since the passivation film PAS is formed so as to cover the pad end, a stepped portion is formed in the passivation film PAS which covers the pad end, and a strong stress induced by deformation of the pad PAD is applied to the said stepped portion. Consequently, there is a fear of a crack being developed in the stepped portion formed in the passivation film PAS.

In this first embodiment, however, a second planar distance (L2) between one end of the electrode layer EL1 and one end of the pad PAD is set larger than a first planar distance (L1) between one end of the electrode layer EL1 and one end of the opening OP. Even in the event of deviation of the coupled position of the wire W to an end side of the electrode layer EL1, since the second planar distance (L2) between one end of the electrode layer EL1 and one end of the pad PAD is large, a stress caused by coupling the wire W to the stepped portion of the electrode layer EL1 can be prevented from being transmitted up to an end portion of the pad PAD. As a result, the deformation at an end portion of the pad PAD is diminished and it is possible to diminish the stress applied to the stepped portion of the passivation film PAS which covers the pad end. Once the stress applied to the stepped portion of the passivation film PAS is diminished, it is possible to suppress the occurrence of a crack CLK caused by a large stress. Thus, according to this first embodiment, even in the event of a positional deviation of the wire W coupled to the electrode layer EL1, it is possible to suppress the occurrence of a crack CLK in the passivation film PAS and hence possible to improve the reliability of the semiconductor device SA in this first embodiment.

Figure 28:
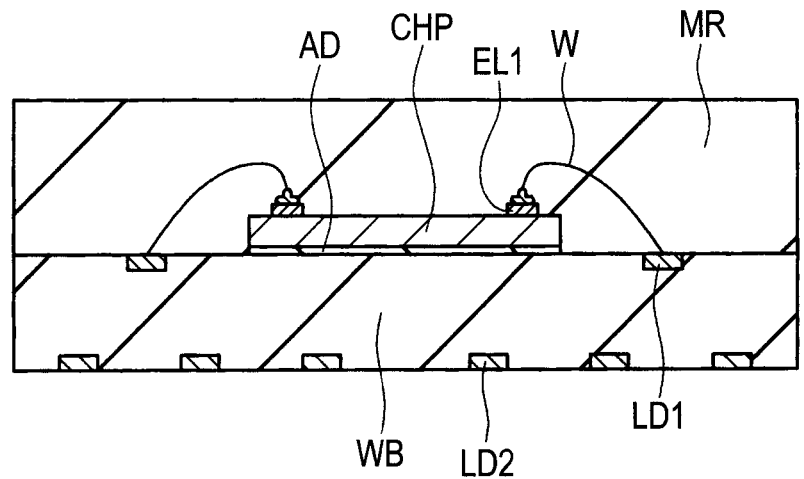
FIG. 28 is a sectional view showing a semiconductor device manufacturing step which follows FIG. 25.
Figure 29:
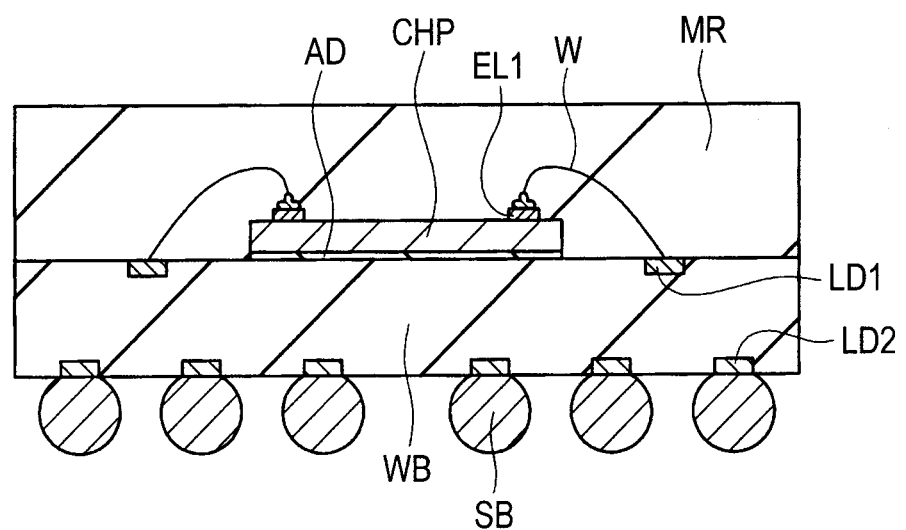
FIG. 29 is a sectional view showing a semiconductor device manufacturing step which follows FIG. 28.

Next, as shown in FIG. 28, the main surface of the wiring board WB is sealed with resin MR so as to cover both semiconductor chip CHP and wire W. Thereafter, as shown in FIG. 29, a solder ball SB is mounted on each lead LD2 formed on the back surface of the wiring board WB. Then, the multi-package board comprising a series of wiring boards WB is cut. In this way it is possible to manufacture the semiconductor device in this first embodiment.

Second Embodiment

<Feature of Technical Idea in Second Embodiment>

In this second embodiment a description will be given below about a technical idea of dividing a planar area of a rectangular electrode layer EL into a first area coupled to a pad PAD through an opening OP and a second area coupled to a wire W.

Figure 30:
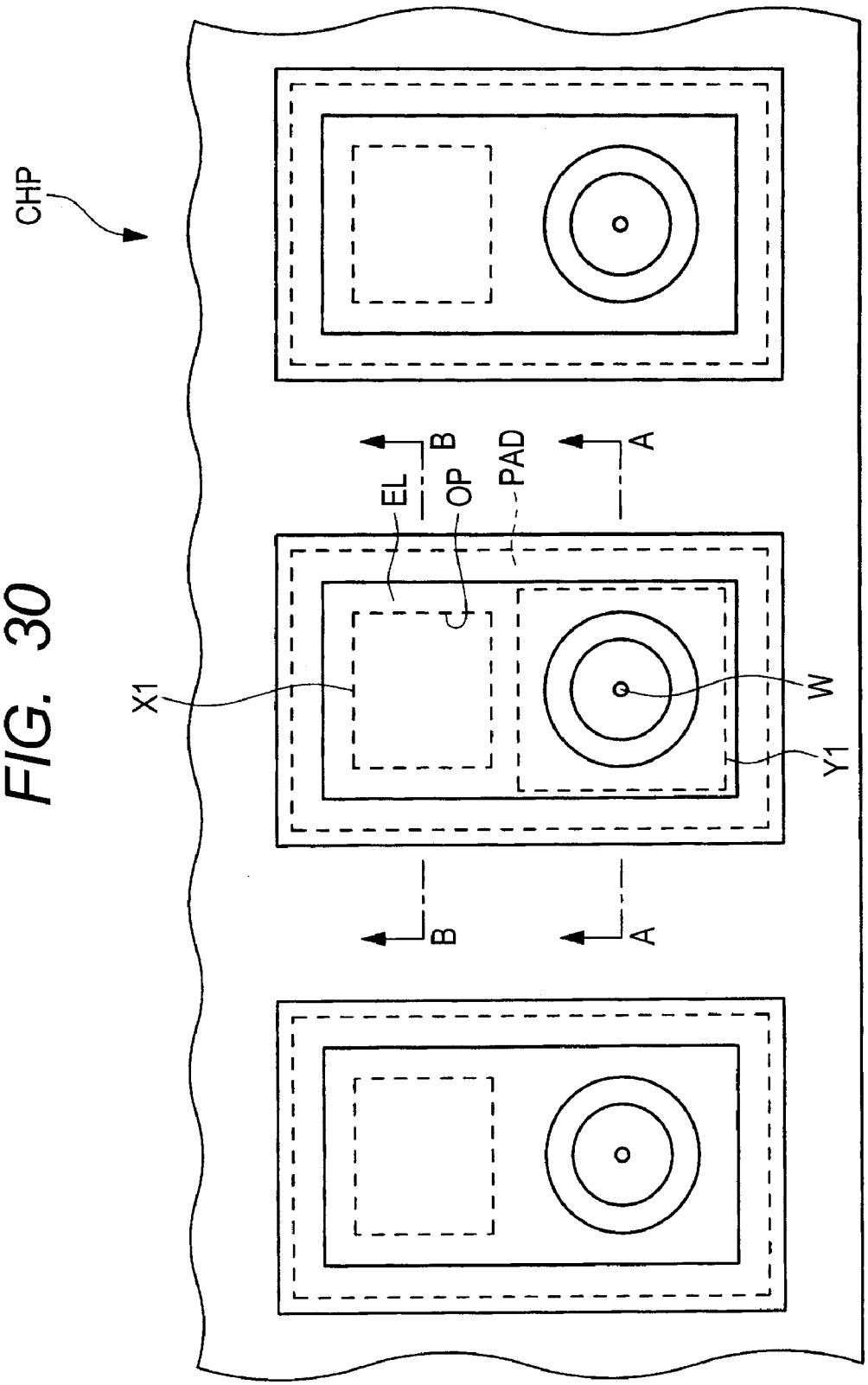
FIG. 30 is a plan view embodying the technical idea of a second embodiment of the present invention and showing pads arranged adjacently.

FIG. 30 is a plan view showing pads PAD formed on a semiconductor chip in this second embodiment. In FIG. 30 there are shown three pads PAD which are arranged along one side of the semiconductor chip CHP. As shown in FIG. 30, each PAD is, for example, in a quadrangular shape such as a rectangle and an electrode layer EL is formed so as to be planarly included in the pad PAD. The electrode layer EL has a first area and a second area. The first area is coupled through an opening OP to a pad PAD formed in a lower layer. On the other hand, a wire W is coupled to the second area. Thus, in this second embodiment, a planar area of the electrode layer EL is divided into the first area (an area X1 enclosed with a broken line representing an area of the opening OP in FIG. 30) which is coupled to the pad PAD through the opening OP and a second area (an area Y1 in FIG. 30) which is coupled to the wire W. This second embodiment is characteristic in that the opening OP coupled to the first area and the wire W coupled to the second area are disposed so as not to overlap each other planarly. Particularly, the second area in the electrode layer EL has an area larger than that of the first area in the electrode layer EL.

Figure 31:
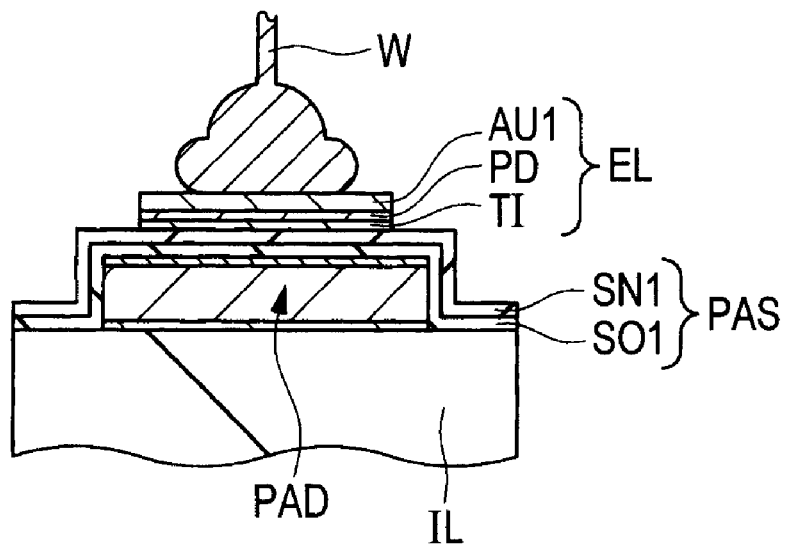
FIG. 31 is a sectional view taken on line A-A in FIG. 30.

FIG. 31 is a sectional view taken on line A-A in FIG. 30. That is, FIG. 31 is a sectional view taken through the second area in the electrode layer EL. As shown in FIG. 31, a pad PAD is formed on an interlayer dielectric film IL and a passivation film PAS which is an insulating film is formed on the interlayer dielectric film IL covering the pad PAD. As in the first embodiment, the passivation film PAS used in this second embodiment is a laminate of silicon oxide film SO1 and silicon nitride film SN1. That is, the passivation film PAS is formed so as to cover the entire surface of the pad PAD. The surface of the passivation film PAS formed on the pad PAD is also flat, reflecting the flatness of the pad surface. An electrode layer EL is formed on the passivation film PAS. The electrode layer EL is comprised of titanium film TI, palladium film PD and gold film AU1. The surface of the electrode layer EL formed on the passivation film PAS is also flat and a wire W is coupled onto the electrode layer EL.

Thus, it is seen that the wire W is formed on the second area having flatness of the electrode layer EL. When seen in plan, the second area of the electrode layer EL includes a bonding area of the wire W which is coupled in the second area. According to this second embodiment, since the wire W is coupled so as to be included in the flat second area of the electrode layer EL, the load and ultrasonic wave which are applied in the wire bonding process of coupling the wire W to the electrode layer EL are dispersed and it is possible to suppress a local concentration of the load. That is, according to this second embodiment, since the load transmitted to the passivation film PAS which underlies the electrode layer EL can be prevented from being localized, it is possible to prevent the occurrence of a crack CLK in the passivation film PAS.

Figure 32:
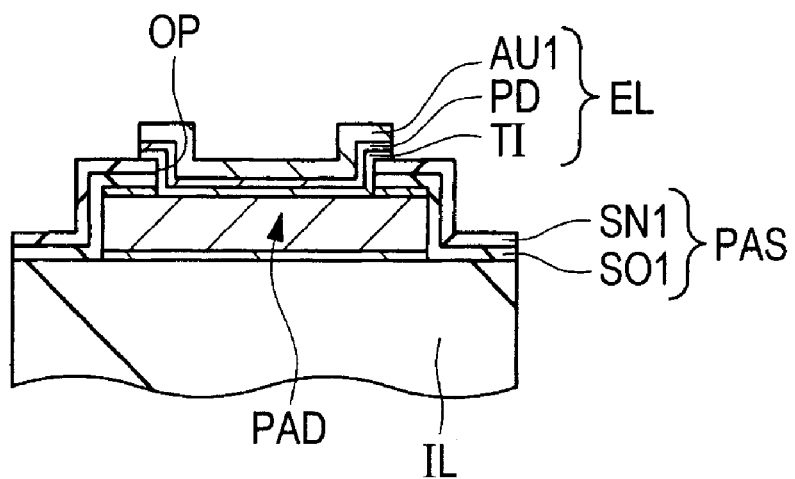
FIG. 32 is a sectional view taken on line B-B in FIG. 30.

FIG. 32 is a sectional view taken on line B-B in FIG. 30. That is, FIG. 32 is a sectional view taken through the first area of the electrode layer EL. As shown in FIG. 32, a pad PAD is formed on an interlayer dielectric film IL and a passivation film PAS is formed so as to cover the pad PAD. An opening OP is formed in the passivation film PAS and a part of the surface of the pad PAD is exposed to the bottom of the opening OP. Further, an electrode layer EL is formed so as to overhang the passivation film PAS from the interior of the opening OP. Therefore, a stepped portion which reflects the difference in height attributable to the opening OP is formed in the electrode layer EL. In the first area of the electrode layer EL thus configured, the electrode layer EL is coupled to the pad PAD through the opening OP. That is, the first area of the electrode layer EL is provided as an area for connecting the electrode layer EL and the pad PAD electrically with each other.

Thus, in this second embodiment, the planar area of the electrode layer EL is divided into the first and the second areas so as not to overlap each other planarly and the first area is allowed to function as an area for coupling between the electrode layer EL and the pad PAD, while the second area is allowed to function as an area for coupling between the electrode layer EL and the wire W.

For example, if the whole of the electrode layer EL is comprised of only the first area and the coupled position of wire W is deviated, the wire W strikes on the stepped portion of the electrode layer EL which is formed reflecting the difference in height attributable to the opening OP, and the resulting stress facilitates development of a crack CLK in the passivation film PAS.

On the other hand, in this second embodiment, as described above, the electrode layer EL is divided into the first area formed with a stepped portion and the flat second area. The coupling between the wire W and the electrode layer EL is performed in the flat second area, whereby the wire W can be prevented from striking on the stepped portion formed in the first area of the electrode layer EL. Consequently, it is possible to suppress the occurrence of a crack CLK in the passivation film PAS which is caused by striking of the wire W onto the stepped portion.

Figure 33:
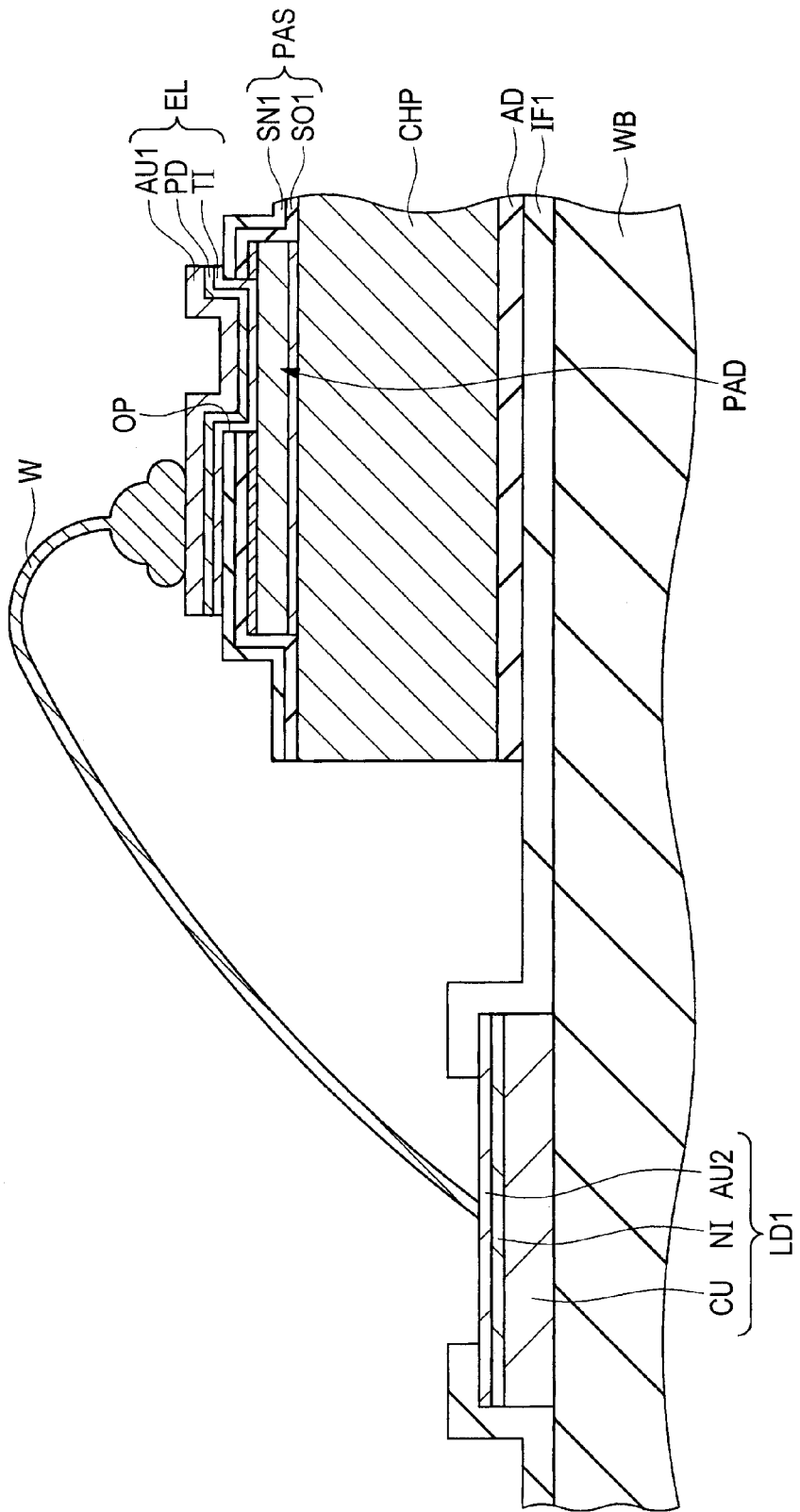
FIG. 33 is a sectional view showing in what manner a semiconductor chip and a wiring board are coupled together through a wire.

FIG. 33 is a sectional view showing a state in which an electrode layer EL formed on the semiconductor chip CHP and an upper lead LD1 formed on the wiring board WB are coupled together through a wire W. In FIG. 33, an upper lead LD1 is formed on the wiring board WB and an insulating film IF1 is formed on the wiring board WB so as to cover the upper lead LD1. An opening is formed in the insulating film IF1 and a part of the surface of the upper lead LD1 is exposed from the opening formed in the insulating film IF1. The upper lead LD1 is formed by a laminate of copper film CU, nickel film NI and gold film AU2.

A semiconductor chip CHP is mounted on the wiring board WB through the insulating film IF1 so as to be adjacent to the upper lead LD1. The semiconductor chip CHP and the insulating film IF1 are bonded together through an insulating adhesive AD. A pad PAD is formed on the surface of the semiconductor chip CHP and a passivation film PAS is formed so as to cover the pad PAD. An opening OP is formed in the passivation film and a part of the surface of the pad PAD is exposed to the bottom of the opening OP. Further, an electrode layer EL is formed so as to overhang the passivation film PAS from the interior of the opening OP. The electrode layer EL and the upper lead LD1 are coupled together through a wire W.

The pad PAD is formed by a laminate of titanium nitride film, aluminum film and titanium nitride film and the passivation film PAS is formed by a laminate of silicon oxide film SO1 and silicon nitride film SN1. The electrode layer EL is formed by a laminate of titanium film TI, palladium film PD and gold film AU1.

As shown n FIG. 33, the electrode layer EL is configured so as to be included in the pad PAD. The pad PAD has a coupling portion coupled with the opening OP formed in the passivation film PAS and a covered portion covered with the passivation film PAS. When seen in plan, the bonding area of the wire W is included in the covered portion of the pad PAD. The covered portion of the pad PAD is covered with the passivation film PAS and is flat and it planarly overlaps the second area of the electrode layer EL formed on the flat passivation film PAS. Therefore, the fact that the bonding area of the wire W is included in the covered portion of the pad PAD means that the wire bonding area is coupled in the flat second area of the electrode layer EL. That is, it can be said that the covered portion of the pad PAD planarly overlaps the second area of the electrode layer EL and that the exposed portion of the pad PAD planarly overlaps the first area of the electrode layer EL.

Further, in this second embodiment, as shown in FIG. 33, the second area in the electrode layer EL has an area larger than that of the first area in the electrode layer EL. That is, the area of the flat second area coupled with the wire W is larger than that of the first area coupled with the opening OP. This means that the flat second area coupled with the wire W has a sufficient margin in comparison with the coupling area of the wire W and that a margin for a positional deviation of the wire W can be ensured. Accordingly, for example even when the coupled position of the wire W is deviated, there is ensured a higher probability of the wire W being coupled within the flat second area without overhanging the first area formed with a stepped portion. As a result, a local stress concentration can be avoided and it is possible to suppress the occurrence of a crack in the passivation film PAS. Thus, according to this second embodiment it is possible to improve the reliability of the semiconductor device. It can therefore be seen that the stepped first area of the electrode layer EL is sufficiently spaced apart from a flat second area of the electrode layer where the wire W is bonded to the electrode layer EL, the flat second area being of sufficient size and distance from the stepped first area to accommodate positional deviation of the wire W.

<Semiconductor Wafer Manufacturing Method>

The semiconductor device according to this second embodiment is configured as above. Next, a method of manufacturing the semiconductor device according to this second embodiment will be described with reference to drawings. First, a disc-like wafer is provided. A main surface (surface) of the semiconductor wafer is partitioned into plural chip areas. For such a semiconductor wafer, semiconductor elements such as MISFETs are formed in each chip area. Thereafter, an interlayer dielectric film is formed so as to cover the MISFETs and a wiring layer is formed. That is, by forming the MISFETs and wiring layer on the semiconductor wafer there is formed an integrated circuit on the semiconductor wafer. The wiring layer has, for example, a multi-layer interconnection structure comprising plural wiring layers. A description will be given below about the process after the process of forming wiring lines in the top layer of the multi-layer interconnections while making reference to chip areas CA1 and CA2 adjacent to each other and a scribing area SBR located between both chip areas CA1 and CA2.

Figure 34:
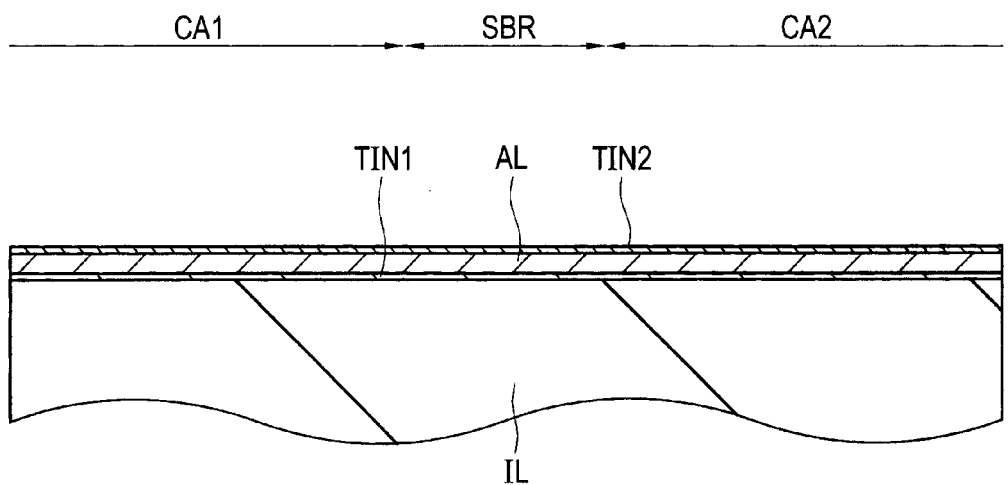
FIG. 34 is a sectional view showing a semiconductor wafer manufacturing step in the second embodiment.

As shown in FIG. 34, for example, titanium nitride film TIN1 is formed on an interlayer dielectric film IL which is silicon oxide film, and aluminum film AL is formed on the titanium nitride film. Further, titanium nitride film TIN2 is formed on the aluminum film AL. The titanium nitride film TIN1, aluminum film AL and titanium nitride film TIN2 can be formed, for example, by a sputtering method.

Figure 35:
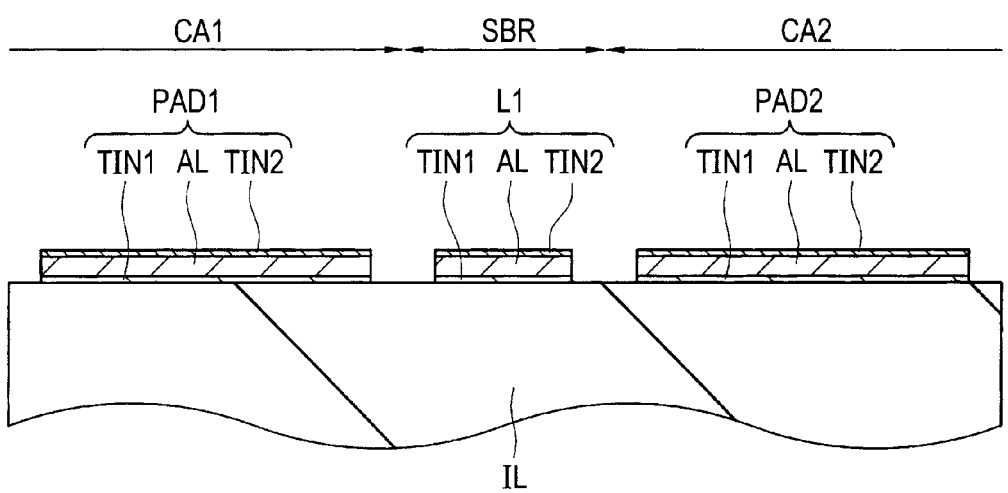
FIG. 35 is a sectional view showing a semiconductor wafer manufacturing step which follows FIG. 34.

Subsequently, as shown in FIG. 35, the titanium nitride film TIN1, aluminum film AL and titanium nitride film TIN2 are subjected to patterning by photolithography technique and etching technique. As a result, in the chip area CA1 is formed a pad PAD1 comprised of titanium nitride film TIN1, aluminum film Al and titanium nitride film TIN2. Likewise, in the chip area CA2 is formed a pad PAD2 comprised of titanium nitride film TIN1, aluminum film AL and titanium nitride film TIN2. Further, in the scribing area SBR is formed an evaluation wiring line L1 comprised of titanium nitride film TIN1, aluminum film AL and titanium nitride film TIN2.

Figure 36:
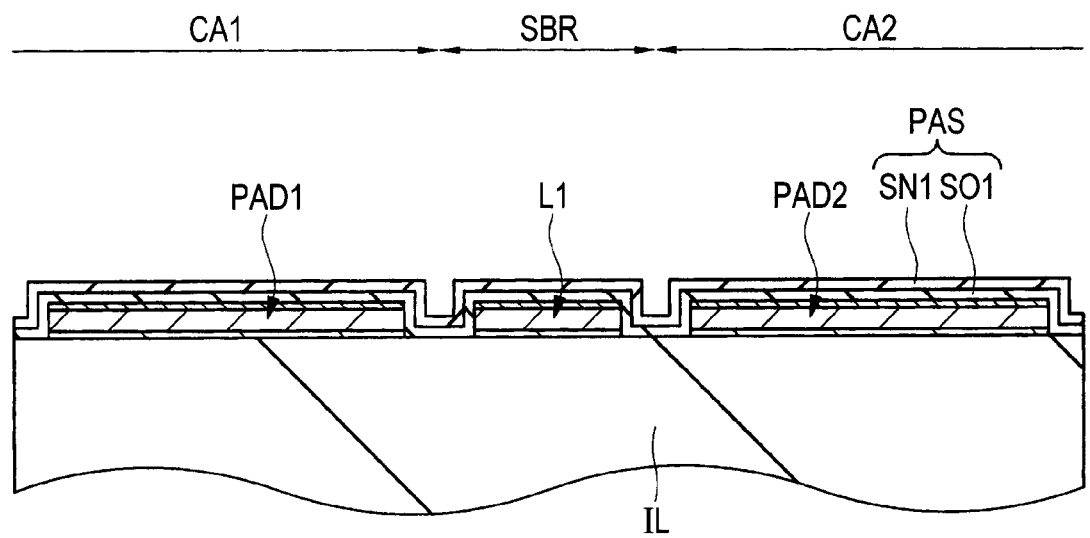
FIG. 36 is a sectional view showing a semiconductor wafer manufacturing step which follows FIG. 35.

Next, as shown in FIG. 36, a passivation film PAS is formed on an interlayer dielectric film IL having formed thereon the pads PAD1, PAD2 and evaluation wiring line L1. The passivation film PAS can be formed, for example, by a CVD method. More specifically, the passivation film PAS is formed by silicon oxide film SO1 and silicon nitride film SN1 formed on the silicon oxide film SO1.

Figure 37:
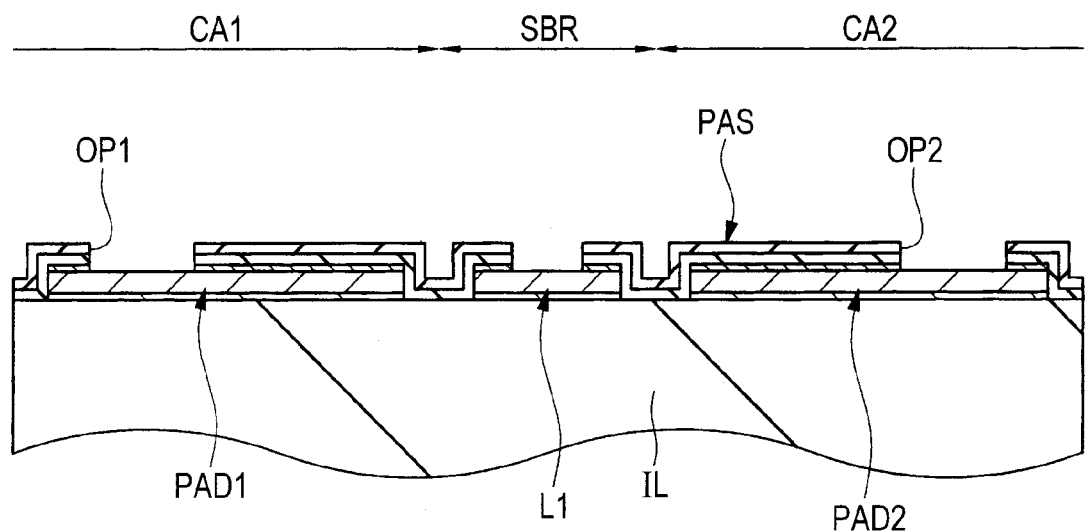
FIG. 37 is a sectional view showing a semiconductor wafer manufacturing step which follows FIG. 36.

Then, as shown in FIG. 37, openings are formed in the passivation film PAS by photolithography technique and etching technique. More specifically, in the chip area CA1 there is formed an opening OP1 to which a part of the surface of the pad PAD1 is exposed, while in the chip area CA2 is formed an opening OP2 to which a part of the surface of the pad PAD2 is exposed. At this time, the titanium nitride film TIN2 is removed from the surface of the pad PAD1 exposed to the bottom of the opening OP1 and the aluminum film AL is exposed. Likewise, the titanium nitride film TIN2 is removed from the surface of the pad PAD2 exposed to the bottom of the opening OP2 and the aluminum film AL is exposed.

Also in the scribing area SBR is formed an opening to which a part of the surface of the evaluation wiring line L1 is exposed. The opening OP1 formed in the pad PAD1 is smaller than the size of the pad PAD1 and the pad PAD1 is formed with a coupling portion for coupling with the opening OP1 and a covered portion covered with the passivation film PAS. Likewise, the opening OP2 formed in the pad PAD2 is smaller than the size of the pad PAD2 and the pad PAD2 is formed with a coupling portion for coupling with the opening OP2 and a covered portion covered with the passivation film PAS.

Figure 38:
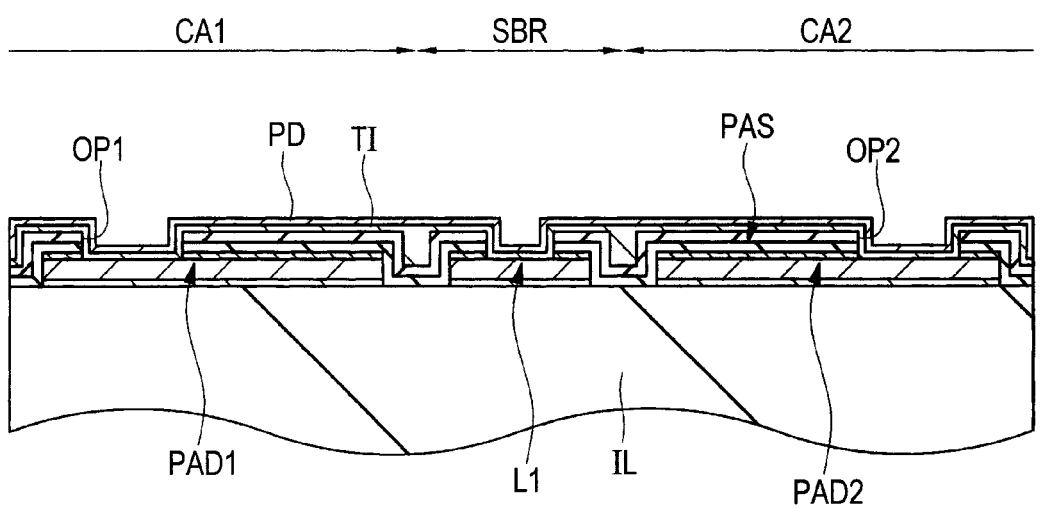
FIG. 38 is a sectional view showing a semiconductor wafer manufacturing step which follows FIG. 37.

Subsequently, as shown in FIG. 38, titanium film TI is formed on the passivation film PAS which includes the interior of the opening OP1 and that of the opening OP2, and palladium film PD is formed on the titanium film TI. The titanium film TI and the palladium film PD can be formed, for example, by a sputtering method.

Figure 39:
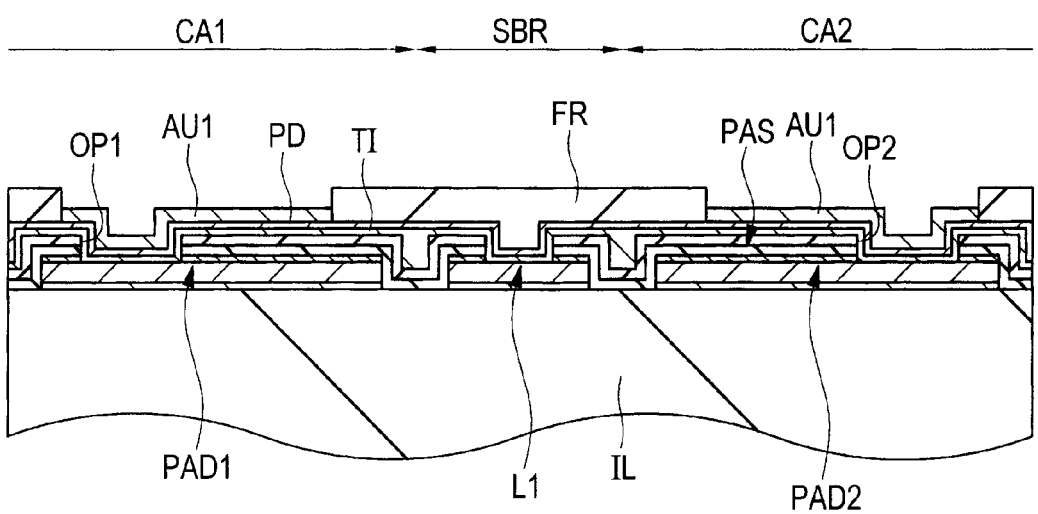
FIG. 39 is a sectional view showing a semiconductor wafer manufacturing step which follows FIG. 38.

Thereafter, as shown in FIG. 39, resist film FR is applied onto the palladium film PD and is then subjected to patterning by exposure and development. The patterning of the resist film FR is performed in such a manner that the resist film FR does not remain in the area where electrode layers are to be formed. Then, by an electrolytic plating method using the titanium film TI and the palladium film PD as electrodes, gold film AU1 is formed on the palladium film PD which is exposed from an opening formed in the resist film FR.

Figure 40:
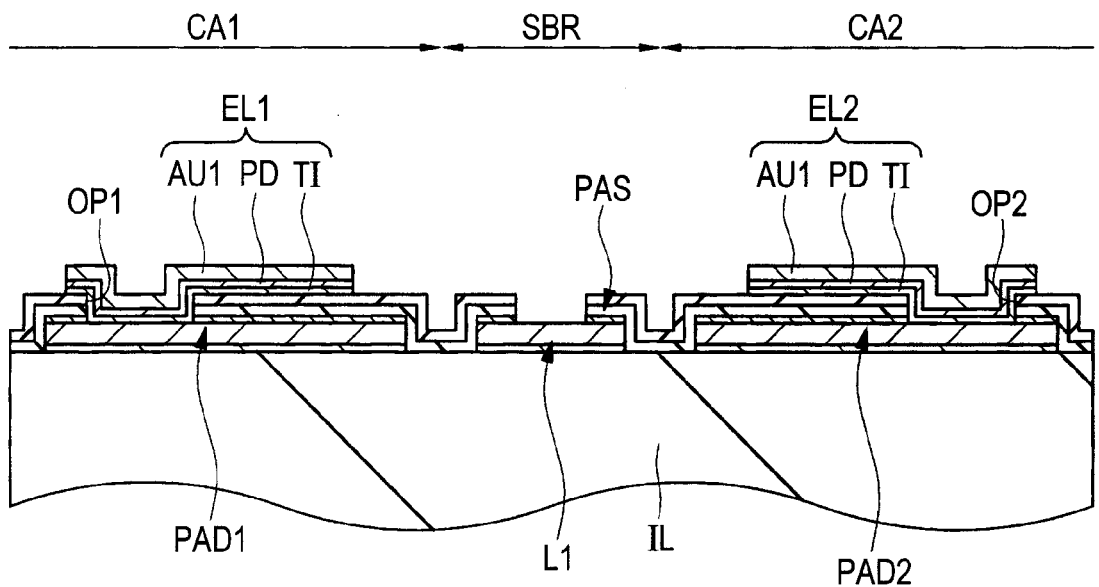
FIG. 40 is a sectional view showing a semiconductor wafer manufacturing step which follows FIG. 39.

Next, as shown in FIG. 40, the patterned resist film FR is removed and thereafter the palladium film and titanium film TI exposed by removal of the resist film FR are removed. In this way electrode layers EL1 and EL2 can be formed on the semiconductor wafer. More specifically, an electrode layer EL1 comprised of titanium film TI, palladium film PD and gold film AU1 is formed in the chip area CAL while an electrode layer EL2 comprised of titanium film TI, palladium film PD and gold film AU1 is formed in the chip area CA2. The electrode layer EL1 formed in the chip area CA1 is formed with a first area which planarly overlaps the opening OP1 and a flat second area for wire coupling, and thus a characteristic structure in this second embodiment is implemented. The electrode layer EL2 formed in the chip area CA2 is also formed with a first area which planarly overlaps the opening OP2 and a flat second area for wire coupling, and thus a characteristic structure in this second embodiment is implemented. In this way it is possible to fabricate the semiconductor wafer in this second embodiment.

<Semiconductor Device Manufacturing Method>

A semiconductor device manufacturing method according to this second embodiment will now be described. This process utilizes the semiconductor wafer fabricated in the process described above. It is optional whether the following process is to be performed after execution of the above semiconductor wafer fabricating process or by buying and using a semiconductor wafer which has been fabricated in accordance with the above process. The semiconductor device manufacturing method in this second embodiment is almost the same as the semiconductor device manufacturing method described in the first embodiment. According to this second embodiment, in the wire bonding process a wire W is coupled in the flat second area of the electrode layer EL. Therefore, according to this second embodiment it is possible to avoid a local stress concentration and hence possible to suppress the occurrence of a crack in the passivation film PAS. As a result, according to this second embodiment it is possible to improve the reliability of the semiconductor device.

<Difference Between the Characteristic Structure in Second Embodiment and the Structure of WPP Technique>

The technique called Wafer Process Package (WPP) in which a package process (post-process) and a wafer process (pre-process) are made integral and packaging is completed in the state of a wafer, is a technique which performs processes up to the package process by applying the wafer process. The WPP technique is advantageous in that the number of steps can be greatly reduced in comparison with the conventional method which performs the package process for each semiconductor chip cut off from a semiconductor wafer.

For example, the structure formed by the WPP technique is as follows. A passivation film is formed so as to cover a pad and an opening is formed in the passivation film. This opening is formed so that a part of the surface of the pad is exposed thereto. A first organic insulating film such as, for example, a photosensitive polyimide resin film is formed on the passivation film formed with the opening and an opening is formed also in the first organic insulating film. The opening formed in the first organic insulating film and the opening formed in the passivation film are connected with each other and the pad surface is exposed to the bottom of the openings. Further, in the WPP technique, a re-wiring line is formed so as to extend over the first organic insulating film from the interior of the openings. That is, the re-wiring line is coupled at one end to the pad exposed to the interior of the openings and an opposite end thereof is formed on the first organic insulating film. A second organic insulating film such as, for example, a photosensitive polyimide resin film is formed so as to cover the re-wiring line and the opposite end of the re-wiring line is exposed from an opening formed in the second organic insulating film. A conductive member such as a wire or a bump electrode is coupled to the other end of the re-wiring line exposed from the second organic insulating film. According to such a WPP technique, the pad formed at a narrow pitch is transformed through the re-wiring line into a terminal formed at a wider pitch than the pad pitch and a conductive member is coupled to the terminal.

The WPP technique is configured as above and a comparison will now be made between the structure based on the WPP technique and the characteristic structure in this second embodiment. First, in the characteristic structure according to the second embodiment, the pad PAD and the first area of the electrode layer EL are coupled together through an opening OP and the second area of the electrode layer EL is coupled to the wire W. On the other hand, in the WPP technique, the pad and one end of the re-wiring line are coupled together through an opening and the opposite end of the re-wiring line is coupled to the conductive member. Thus, it is considered that the electrode layer EL in the second embodiment corresponds to the re-wiring line in the WPP technique.

However, the electrode layer EL in this second embodiment and the re-wiring layer in the WPP technique are different in the following ways.

First, as shown in FIG. 33, the electrode layer EL in this second embodiment is planarly included in the pad PAD. On the other hand, the re-wiring line in the WPP technique is not included in the pad. That is, in the electrode layer EL in this second embodiment both first and second areas are planarly included in the pad PAD. On the other hand, the re-wiring line in the WPP technique aims at transforming a narrow-pitch pad into a terminal formed at a wider pitch than the pad pitch. The re-wiring line extends up to an area not planarly overlapping the pad to form an opposite end. Thus, a first different point resides in that the electrode layer EL in this second embodiment is formed so as to be included in the pad PAD, whereas the re-wiring line in the WPP technique extends up to an area not overlapping the pad planarly.

A second distinction is that in this second embodiment, only the passivation film PAS is present between the pad PAD and the electrode layer EL, whereas in the WPP technique both passivation film and first organic insulating film are present between the pad and the re-wiring line.

Further, a third distinction is that the electrode layer EL in this second embodiment is formed by titanium film TI, palladium film PD and gold film AU1, whereas the re-wiring line in the WPP technique is usually formed by copper film and nickel film and at its opposite end coupled to the conductive member there is formed gold film.

Thus, the first and third distinctions are present between the characteristic structure in this second embodiment and the structure in the WPP technique and it is seen that both are different techniques.

Third Embodiment

Although reference has been made in the above first and second embodiments to an example in which the semiconductor chip CHP and the wiring board WB are coupled together through wires W, reference will be made in this third embodiment to an example in which the semiconductor chip CHP and the wiring board WB are coupled together through bump electrodes BMP.

Figure 41:
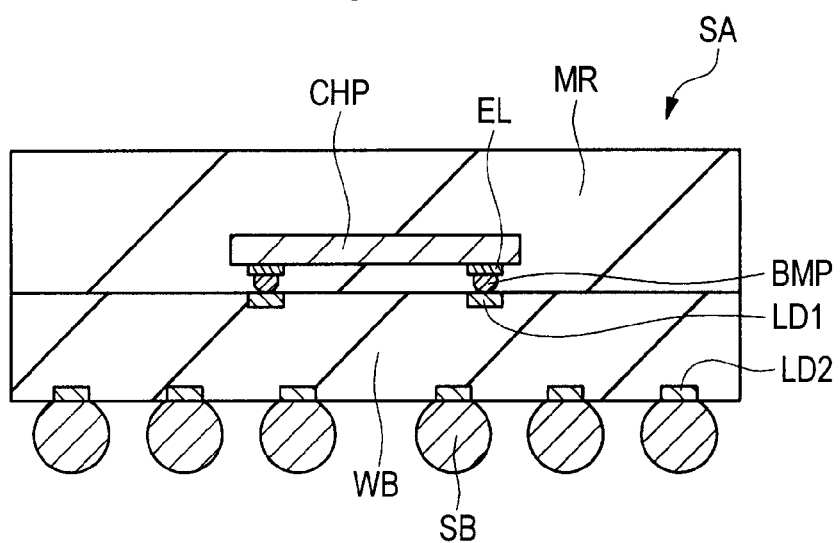
FIG. 41 is a sectional view showing a semiconductor device according to a third embodiment of the present invention.

FIG. 41 is a sectional view showing the configuration of a semiconductor device SA according to this third embodiment. In FIG. 41, the semiconductor device SA in this third embodiment has a wiring board WB. Upper leads LD1 are formed on a main surface (surface) of the wiring board WB and lower leads LD2 are formed on a back surface of the wiring board WB. Further, solder balls SB are mounted on the lower leads LD2 respectively formed on the back surface of the wiring board WB. Multi-layer interconnections and via holes are formed in the interior of the wiring board WB and the upper leads LD1 formed on the main surface of the wiring board WB and the lower leads LD2 formed on the back surface of the wiring board WB are connected together electrically through multi-layer interconnections and via holes formed in the interior of the wring board WB.

A semiconductor chip CHP is mounted on the main surface of the wiring board WB. More specifically, the upper leads LD1 formed on the wiring board WB are coupled through bumps BMP to the electrode layer EL formed on the semiconductor chip CHP. Thus, the semiconductor chip CHP is mounted on the wiring board WB in a state in which a main surface thereof with the electrode layer EL formed thereon faces toward the wiring board WB. On the main surface of the wiring board WB with the semiconductor chip CHP mounted thereon is formed resin (sealing body) MR so as to cover the semiconductor chip CHP.

Although reference has been made in this third embodiment to an example in which the resin MR covers the whole of the semiconductor chip CHP, only the bonded portions (here the bump electrodes BMP) between the semiconductor chip CHP and the wiring board WB may be sealed.

Figure 42:
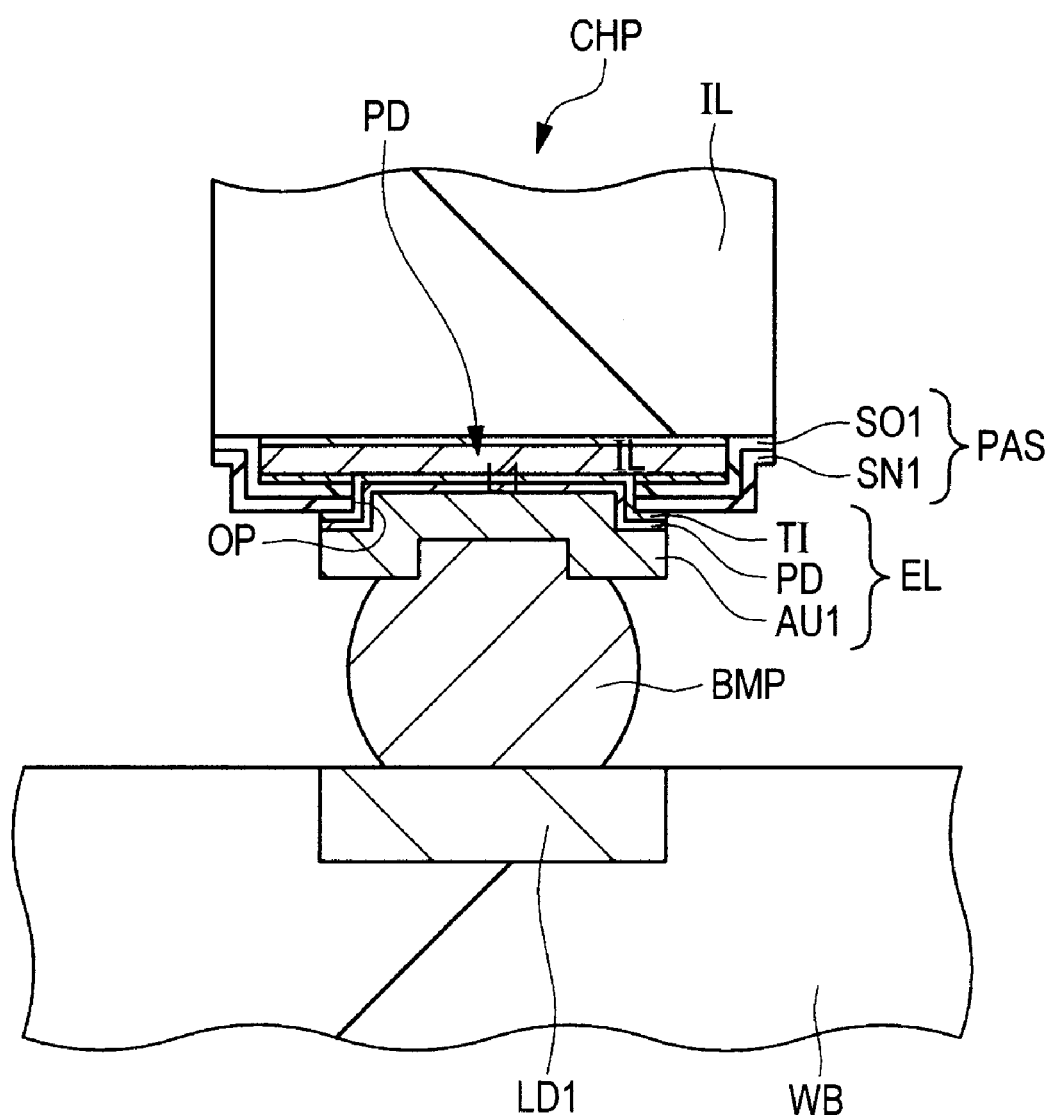
FIG. 42 is a diagram showing on a larger scale a coupled area between a semiconductor chip and a wiring board.

In connection with the semiconductor device SA thus configured, a more detailed description will now be given about the coupling structure between the semiconductor chip CHP and the wiring board WB. FIG. 42 is a diagram showing on a larger scale a coupling area between the semiconductor chip CHP and the wiring board WB in the semiconductor device SA according to this third embodiment. In the semiconductor chip CHP, as shown in FIG. 42, a pad PAD is formed on an interlayer dielectric film IL and a passivation film PAS is formed so as to cover the pad PAD. An opening OP is formed in the passivation film and the pad PAD is exposed from the opening OP. Further, an electrode layer EL is formed so as to overhang the passivation film PAS from the interior of the opening OP. Therefore, the electrode layer EL is formed with a stepped portion reflecting the difference in height attributable to the opening OP. The electrode layer EL and a lead LD1 formed on the wiring board WB are disposed so as to confront each other and a bump electrode BMP is formed between the electrode layer EL and the lead LD1. In this way the semiconductor chip CHP and the wiring board WB are coupled together.

In this third embodiment, when coupling the electrode layer EL and the lead LD1 with each other through the electrode BMP, a load is applied to the electrode layer EL. The load applied to the stepped portion of the electrode layer EL is transmitted as stress to the pad PAD formed in a lower layer. As a result, the pad PAD is deformed and a strong stress is imposed on the stepped portion of the passivation film PAS which covers an end portion of the pad PAD. Consequently, a crack is apt to occur in the passivation film.

The previous first embodiment solves the problem that a crack is developed in the passivation film PAS with a strong stress imposed on the stepped portion of the passivation film PAS which covers an end portion of the pad PAD in the event of a positional deviation of wire W coupled to the electrode layer EL. However, it is seen that the problem of cracking in the passivation film PAS arises also in case of coupling the electrode layer EL and the upper lead LD1 through the bump electrode BMP as in this third embodiment. Therefore, the technical idea explained in the first embodiment is applicable also to the case where the semiconductor chip CHP and the wiring board WB are flip-chip-coupled with each other through the bump electrode BMP.

More specifically, also in this third embodiment, by setting a second planar distance (L2) between one end of the electrode layer and one end of the pad PAD larger than a first planar distance (L1) between one end of the electrode layer EL and one end of the opening OP it is possible to prevent stress induced by a load in flip-chip coupling from being transmitted up to an end portion of the pad PAD. As a result, deformation at the pad end is diminished and it is possible to reduce stress applied to the stepped portion of the passivation film PAS which covers the pad end. Once the stress applied to the stepped portion of the passivation film PAS is reduced, it is possible to suppress the occurrence of a crack caused by a large stress. Thus, according to this third embodiment it is possible to suppress the occurrence of a crack in the passivation film PAS and hence possible to obtain an unexpected result that the reliability of the semiconductor device SA in this third embodiment can be improved.

In the semiconductor device SA in which the electrode layer EL and the upper lead LD1 are coupled together through a wire W as in the previous first embodiment, the electrode layer EL is thin. On the other hand, in the semiconductor device SA according to this third embodiment in which the electrode layer EL and the upper lead LD1 are coupled together through a bump electrode BMP, the electrode layer EL is thick. That is, the thickness of the electrode layer EL in this third embodiment is larger than that of the electrode layer EL in the first embodiment. In this connection, the thinner the electrode layer EL, the easier the transfer of the force exerted on the electrode layer EL to the passivation film PAS through deformation of the pad PAD. In case of mounting the semiconductor chip CHP onto the wiring board WB through bump electrodes BMP, the load is dispersed because the chip is mounted onto the wiring board WB through plural bump electrodes BMP and the stress applied to each pad PAD becomes smaller than in case of coupling the semiconductor chip CHP and the wiring board WB through wires W. That is, the wire-bonded product with the semiconductor chip CHP mounted on the wiring board WB through wires W is more likely to undergo cracking in the passivation film PAS than the flip-chip mounted product with the semiconductor chip CHP mounted on the wiring board WB through bump electrodes BMP. Therefore, the technical idea of the present may provide better results when applied to the semiconductor device SA (wire-bonded product) in the first embodiment than when applied to the semiconductor device SA (flip-chip-mounted product) in this third embodiment.

Although the present invention has been described above concretely by way of embodiments thereof, it goes without saying that the present invention is not limited to the above embodiments, but that various changes may be made within the scope not departing from the gist of the invention.

For example, although reference has been made in each of the above first to third embodiments to MISFET (Metal Insulator Semiconductor Field Effect Transistor) as an example of a semiconductor element, the semiconductor element may be MOSFET (Metal Oxide Semiconductor Field Effect Transistor).

Moreover, although in each of the above first to third embodiments there were used the semiconductor chip CHP formed with plural pads PAD and the wiring board WB formed with plural leads (electrodes) LD1, there may be used a semiconductor chip and a wiring board formed with one pad PAD and one upper lead LD1 respectively.

Furthermore, while the X direction and the Y direction are described in certain embodiments as being orthogonal to one another (i.e., X direction crossing the Y direction at right angles), it is understood that the two directions may simply cross one another at angles other than right angles. In such case, the two pairs of parallel ends may form a rhombus or parallelogram, rather than a square or rectangle, in the plan view.

The present invention is applicable widely to the semiconductor device manufacturing industry.

What is claimed is:
1. A method of manufacturing a semiconductor device, comprising the steps of:
 (a) providing a base member having a lead; and
 (b) disposing a semiconductor chip over the base member, the semiconductor chip including a first main surface, a bonding pad formed over the first main surface, an insulating film formed over the first main surface such that a peripheral portion of the bonding pad is covered with the insulating film, an electrode layer electrically connected with a coupling portion of the bonding pad exposed from an opening formed in the insulating film, and formed over the insulating film, and a second main surface oppo- site to the first main surface, and electrically connecting the bonding pad with the lead via a conductive member and the electrode layer, wherein in a plan view, a second distance between a first end portion of the electrode layer and a first end portion of the bonding pad is larger than a first distance between the first end portion of the electrode layer and a first end portion of the opening formed in the insulating film.

2. A method according to claim 1, wherein, when seen in plan, the bonding pad, the electrode layer and the opening formed in the insulating film are each quadrangular in shape, one side of the bonding pad, one side of the electrode layer and one side of the opening are parallel to one another, wherein in a first direction parallel to one side of the bonding pad, a second spacing between a second end portion of the electrode layer and a second end portion of the bonding pad is larger than a first spacing between the second end portion of the electrode layer and a second end portion of the opening formed in the insulating film, and wherein in a second direction which crosses the first direction, a second spacing between an end portion of the electrode layer and an end portion of the bonding pad is larger than a first spacing between an end portion of the electrode layer and an end portion of the opening formed in the insulating film.

3. A method according to claim 1, wherein, when seen in plan, a footprint of the opening falls within a footprint of the electrode layer, and a footprint of the electrode layer falls within the footprint of the pad.

4. A method according to claim 1, wherein the semiconductor chip is obtained by the following steps (c) and (d):

(c) providing a semiconductor wafer, the semiconductor wafer having a plurality of chip areas and a scribing area formed between adjacent chip areas out of the chip areas; and (d) after the step (c), cutting the semiconductor wafer along the scribing area to obtain a plurality of semiconductor chips.

5. A method according to claim 4, wherein the step (c) comprises the following steps:

(c1) forming a bonding pad in each of the chip areas defined over a first main surface of the semiconductor wafer;

(c2) forming the insulating film over the first main surface of the semiconductor wafer so as to cover the bonding pad;

(c3) patterning the insulating film to form the opening with a part of a surface of the bonding pad exposed thereto while covering a peripheral portion of the bonding pad;

(c4) forming a conductor film over the insulating film including an interior of the opening; and (c5) patterning the conductor film to form the electrode layer embedded within the opening and with an end portion thereof formed over the insulating film.

6. A method according to claim 5, wherein by adjusting a formed position of an end portion of the bonding pad out of the bonding pad formed in the step (c1), the opening formed in the step (c3) and the electrode layer formed in the step (c5), the bonding pad, the opening and the electrode layer are formed so as to establish a positional relation such that said second distance is larger than said first distance.

7. A method according to claim 5, wherein by adjusting a formed position of an end portion of the opening out of the bonding pad formed in the step (c1), the opening formed in the step (c3) and the electrode layer formed in the step (c5), the bonding pad, the opening and the electrode layer are formed so as to establish a positional relation such that said second distance is larger than said first distance.

8. A method according to claim 5, wherein by adjusting a formed position of an end portion of the electrode layer out of the bonding pad formed in the step (c1), the opening formed in the step (c3) and the electrode layer formed in the step (c5), the bonding pad, the opening and the electrode layer are formed so as to establish a positional relation such that said second distance is larger than said first distance.

9. A method according to claim 1, wherein the conductive member is a wire.

10. A method according to claim 1, wherein the conductive member is a bump electrode.

11. A method according to claim 1, wherein the insulating film is a passivation film.

12. A method according to claim 11, wherein the insulating film is formed by silicon oxide film and silicon nitride film formed over the silicon oxide film.

13. A method according to claim 1, wherein the electrode layer is formed by a laminate film.

14. A method according to claim 13, wherein the bonding pad includes aluminum film exposed to a surface of the bonding pad, wherein the conductive member is formed of metal, and wherein the electrode layer is formed by titanium film formed over the bonding pad, palladium film formed over the titanium film, and gold film formed over the palladium film.

15. A method according to claim 1, wherein a thickness of the insulating film is smaller than that of the bonding pad.

16. A method of manufacturing a semiconductor device, comprising the steps of:

(a) providing a base member having a lead; and (b) disposing a semiconductor chip over the base member, the semiconductor chip including a first main surface, a bonding pad formed over the first main surface, an insulating film formed over the first main surface such that a peripheral portion of the bonding pad is covered with the insulating film, an electrode layer electrically connected with a coupling portion of the bonding pad exposed from an opening formed in the insulating film, and formed over the insulating film, and a second main surface opposite to the first main surface, and electrically connecting the bonding pad with the lead via a conductive member and the electrode layer, wherein in a plan view, the electrode layer has a first portion overlapping the coupling portion and a second portion overlapping the insulating film in an area not formed with the coupling portion, wherein the area of the second portion is larger than that of the first portion, and wherein the conductive member is coupled at the second portion of the electrode layer.

17. A method according to claim 16, wherein, when seen in plan, the second portion of the electrode layer includes a bonding area of the conductive member coupled at the second portion.

18. A method according to claim 16,
wherein the bonding pad has the coupling portion coupled with an opening formed in the insulating film and a covered portion covered with the insulating film, and
wherein when seen in plan, a bonding area of the conductive member is included in the covered portion of the bonding pad.

19. A method according to claim 16, wherein the semiconductor chip is obtained by the following steps (c) and (d):
  (c) providing a semiconductor wafer, the semiconductor wafer having a plurality of chip areas and a scribing area formed between adjacent chip areas out of the chip areas; and
  (d) after the step (c), cutting the semiconductor wafer along the scribing area to obtain a plurality of semiconductor chips.

20. A method according to claim 19,
wherein the step (c) comprises the following steps:
  (c1) forming a bonding pad in each of the chip areas defined over a first main surface of the semiconductor wafer;
  (c2) forming the insulating film over the first main surface of the semiconductor wafer so as to cover the bonding pad;
  (c3) patterning the insulating film to form the opening with a part of a surface of the bonding pad exposed thereto while covering the peripheral portion of the bonding pad;
  (c4) forming a conductor film over the insulating film including the interior of the opening; and
  (c5) patterning the conductor film to form the electrode layer embedded within the opening and with an end portion thereof formed over the insulating film.

21. A method of manufacturing a semiconductor device, comprising the steps of:
  providing a substrate;
  forming a bonding pad over the substrate, the bonding pad having a footprint defined by a first pair of parallel ends extending in a first direction and connecting to a second pair of parallel ends extending in a second direction which crosses the first direction;
  forming a first film over at least a portion of the bonding pad;
  forming an opening in the first film, the opening having a second footprint defined by a third pair of parallel ends extending in the first direction and connecting to a fourth pair of parallel ends extending in the second direction, the second footprint being entirely within the first footprint; and
  forming an electrode layer over at least a portion of the bonding pad including over the opening, the electrode layer having a third footprint defined by a fifth pair of parallel ends extending in the first direction which connect to a sixth pair of parallel ends extending in the second direction;
such that:
the third footprint is entirely within the first footprint;
the second footprint is entirely within the third footprint; and
a first spacing between a first end of the fifth pair and a first end of the third pair is less than a second spacing between the first end of the fifth pair and a first end of the first pair.

22. A method according to claim 21, wherein:
a first spacing between a second end of the fifth pair and a second end of the third pair is less than a second spacing between the second end of the fifth pair and a second end of the first pair.

23. A method according to claim 22, wherein:
a first spacing between a first end of the sixth pair and a first end of the fourth pair is less than a second spacing between the first end of the sixth pair and a first end of the second pair; and
a first spacing between a second end of the sixth pair and a second end of the fourth pair is less than a second spacing between the second end of the sixth pair and a second end of the second pair.

24. A method according to claim 21, comprising:
forming the electrode layer over a portion of the first film in addition to over the opening.

25. A method according to claim 21, wherein:
the first film comprises a passivation layer.

26. A method according to claim 21, wherein:
the second direction is orthogonal to the first direction.

* * * * *